(12) United States Patent
Kusuda

(10) Patent No.: US 10,760,895 B2
(45) Date of Patent: Sep. 1, 2020

(54) LENGTH MEASUREMENT DEVICE

(71) Applicant: Nidec-Read Corporation, Kyoto (JP)

(72) Inventor: Tatsufumi Kusuda, Kyoto (JP)

(73) Assignee: Nidec-Read Corporation, Kyoto (JP)

( * ) Notice: Subject to any disclaimer, the term of this patent is extended or adjusted under 35 U.S.C. 154(b) by 0 days.

(21) Appl. No.: 16/335,267

(22) PCT Filed: Sep. 26, 2017

(86) PCT No.: PCT/JP2017/034720
§ 371 (c)(1),
(2) Date: Mar. 21, 2019

(87) PCT Pub. No.: WO2018/062169
PCT Pub. Date: Apr. 5, 2018

(65) Prior Publication Data
US 2020/0018590 A1    Jan. 16, 2020

(30) Foreign Application Priority Data

Sep. 30, 2016 (JP) ................................ 2016-194295

(51) Int. Cl.
*G01B 11/02* (2006.01)
*G01B 11/14* (2006.01)
(Continued)

(52) U.S. Cl.
CPC .............. *G01B 11/02* (2013.01); *G01B 11/14* (2013.01); *G01B 11/2513* (2013.01);
(Continued)

(58) Field of Classification Search
None
See application file for complete search history.

(56) References Cited

U.S. PATENT DOCUMENTS

2014/0146299 A1  5/2014 Nomura et al.
2019/0101383 A1* 4/2019 Ioachim .................. B29C 70/30

FOREIGN PATENT DOCUMENTS

| JP | H04-080609 | 3/1992 |
| JP | H04-144300 | 5/1992 |
| JP | H05-010722 | 1/1993 |

OTHER PUBLICATIONS

"International Search Report (Form PCT/ISA/210) of PCT/JP2017/034720," dated Dec. 26, 2017, with English translation thereof, pp. 1-2.

* cited by examiner

*Primary Examiner* — Michelle M Iacoletti
(74) *Attorney, Agent, or Firm* — JCIPRNET

(57) ABSTRACT

A length measurement device includes: a placement table; cameras imaging images of imaging ranges including target points; first marks within the imaging ranges; a reference position storage unit storing positions of the first marks on a placement surface as first mark reference positions; an image position acquisition unit acquiring, on the basis of the imaged images of the cameras, the target image positions of the target points in the imaged images and the first mark image positions of the first marks in the imaged images; a target position acquisition unit determining positions of the target points on the placement surface on the basis of the target image positions and first mark image positions in the imaged images and the first mark reference positions on the placement surface; and a length acquisition unit determining, on the basis of positions of the target points, the length of a portion to have the length thereof measured.

20 Claims, 12 Drawing Sheets

(51) Int. Cl.
*G01B 11/25* (2006.01)
*G01B 21/04* (2006.01)
*G03F 9/00* (2006.01)
*G06T 1/00* (2006.01)
*G06T 7/00* (2017.01)

(52) U.S. Cl.
CPC ......... *G01B 21/045* (2013.01); *G03F 9/7015* (2013.01); *G06T 1/0007* (2013.01); *G06T 7/00* (2013.01)

LENGTH MEASUREMENT DEVICE

CROSS-REFERENCE TO RELATED APPLICATION

This application is a 371 application of the international PCT application serial no. PCT/JP2017/034720, filed on Sep. 26, 2017, which claims the priority benefit of Japan application no. 2016-194295, filed on Sep. 30, 2016. The entirety of each of the abovementioned patent applications is hereby incorporated by reference herein and made a part of this specification.

TECHNICAL FIELD

The present invention relates to a length measurement device which measures a length of an object to be measured.

BACKGROUND ART

Conventionally, as a length measurement device which measures a length of an object to be measured, a device in which one end of an object to be measured is photographed with a camera, the camera is moved to the other end of the object to be measured and a length is measured from a movement amount of the camera is known (for example, refer to Patent Literature 1).

CITATION LIST

Patent Literature

[Patent Literature 1]
Japanese Unexamined Patent Application Publication No. H5-10722

SUMMARY OF INVENTION

However, when one side of the object to be measured is long, for example about 30 cm to 1 m, a movement distance of the camera becomes long, and thus it may be difficult to accurately detect the movement distance. Also, due to the time taken to move the camera, it is difficult to shorten a measurement time.

On the other hand, there is a need to measure the length of the object to be measured having a large size, such as a size of an electrode plate used for a fuel cell, with high accuracy in units of μm. A length measurement device which measures the length of such a large-sized object to be measured with high accuracy is commercially available from a measurement device manufacturer (for example, Nikon Corporation, the NEXIV (registered trademark) series).

However, such a highly accurate length measurement device, which is commercially available from the measurement device maker, is mainly designed for research and development applications, and measurement therewith takes time. For this reason, it is difficult to use such a highly accurate length measurement device for product inspection in a mass production line of a factory, or the like.

An objective of the present invention is to provide a length measurement device in which a measurement time may readily be shortened while measurement accuracy is improved when a length of an object to be measured having a large size is measured.

A length measurement device according to one aspect of the present invention includes a placement table having a placement surface including a placement region on which an object to be measured is placed, first imaging units provided to respectively correspond to target points which are both ends of a length measurement target portion of the object to be measured that is placed on the placement region and configured to capture an image of an imaging range disposed to include the corresponding target points when the object to be measured is placed on the placement region, first marks respectively provided in a plurality of imaging ranges outside the placement region on the placement surface, a reference position storage unit configured to store positions of the plurality of first marks on the placement surface as first mark reference positions in advance, an image position acquisition unit configured to perform an image position acquiring process of acquiring a target image position which is a position of each of the target points in each of captured images and a first mark image position which is a position of each of the first marks in each of the captured images on the basis of the captured images captured by each of the first imaging units when the object to be measured is placed on the placement region, a target position acquisition unit configured to obtain a position of each of the target points on the placement surface on the basis of the target image position and the first mark image position corresponding to each of the plurality of captured images and each of the first mark reference positions which is a position of each of the first marks on the placement surface, and a length acquisition unit configured to obtain a length of the length measurement target portion on the basis of the position of each of the target points obtained by the target position acquisition unit.

DESCRIPTION OF EMBODIMENTS

Figure 1:
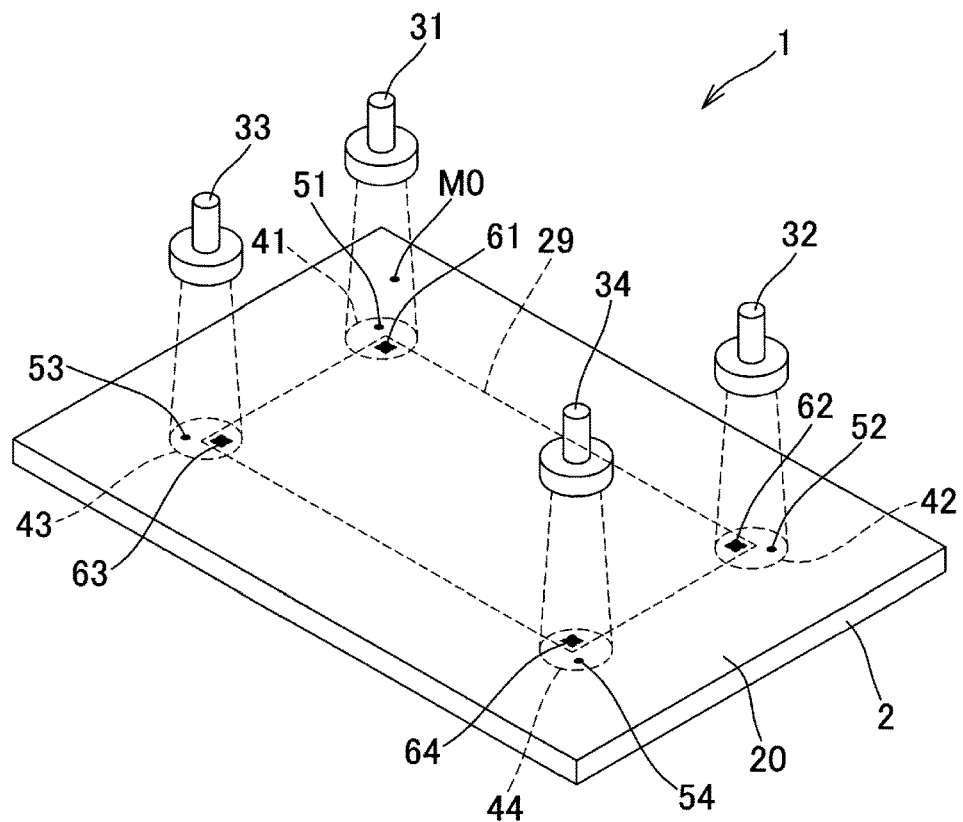
FIG. 1 is a conceptual diagram schematically showing an example of a configuration of a length measurement device according to a first embodiment of the present invention.

Hereinafter, embodiments of the present invention will be described with reference to the drawings. Elements designated by the same reference numerals in each of the drawings indicate that they have the same configuration, and description thereof will be omitted.

First Embodiment

FIG. 1 is a conceptual diagram schematically showing an example of a configuration of a length measurement device according to a first embodiment of the present invention. The length measurement device 1 shown in FIG. 1 exemplifies a configuration in a case in which a size of a substantially rectangular sheet-shaped object to be measured, for example, a length of each side of the object to be measured is measured. In the example shown in FIG. 1, an electrode plate A used for a battery or the like is exemplified as an object to be measured.

The length measurement device 1 shown in FIG. 1 roughly includes a placement table 2 having a substantially plate-like shape, and four cameras 31, 32, 33, and 34 (a first image capturing unit) disposed above the placement table 2. Hereinafter, the cameras 31, 32, 33, and 34 are collectively referred to as cameras 3.

The placement table 2 is formed of, for example, aluminum or the like. An upper surface of the placement table 2 is a flat placement surface 20 which widens in a substantially horizontal direction. A placement region 29 on which the electrode plate A is placed is provided substantially at a center of the placement surface 20. The placement region 29 has a substantially rectangular shape in accordance with a contour of the electrode plate A.

For example, the cameras 3 take an image using an image pickup device such as a charge coupled device (CCD) and a complementary metal oxide semiconductor (CMOS) and generates image data indicating the image. The cameras 31, 32, 33, and 34 capture imaging ranges 41, 42, 43, and 44 on the placement surface 20, respectively. The cameras 31, 32, 33, and 34 are disposed in the imaging ranges 41, 42, 43, and 44 so that each of four corners of the placement region 29 is included.

Hereinafter, an image of the imaging range 41 captured by the camera 31 is referred to as a captured image G1, an image of the imaging range 42 captured by the camera 32 is referred to as a captured image G2, an image of the imaging range 43 captured by the camera 33 is referred to as a captured image G3, and an image of the imaging range 44 captured by the camera 34 is referred to as a captured image G4.

Further, first marks 51, 52, 53, and 54 which allow image recognition are formed at positions within the imaging ranges 41, 42, 43, and 44 and outside the placement region 29 on the placement surface 20. Hereinafter, the first marks 51, 52, 53, and 54 are collectively referred to as first marks 5. In the example shown in FIG. 1, the first marks 5 are black circular images.

Further, second marks 61, 62, 63, and 63 which allow image recognition are formed at positions spaced apart from the first marks 51, 52, 53, and 54 within the imaging ranges 41, 42, 43, and 44 on the placement surface 20. Hereinafter, the second marks 61, 62, 63, and 64 are collectively referred to as second marks 6. In the example shown in FIG. 1, the second marks 6 black rectangular images.

The first marks 5 and the second marks 6 are marks having different representations which can be distinguished from each other. This is preferable in that an imaging direction can be identified from the captured image. However, the first marks 5 and the second marks 6 may be marks having the same image.

An origin mark M0 serving as an origin of position coordinates set on the placement surface 20 is formed in the vicinity of a corner portion of the placement surface 20, for example, in the vicinity of an upper left corner in FIG. 1.

Figure 2:
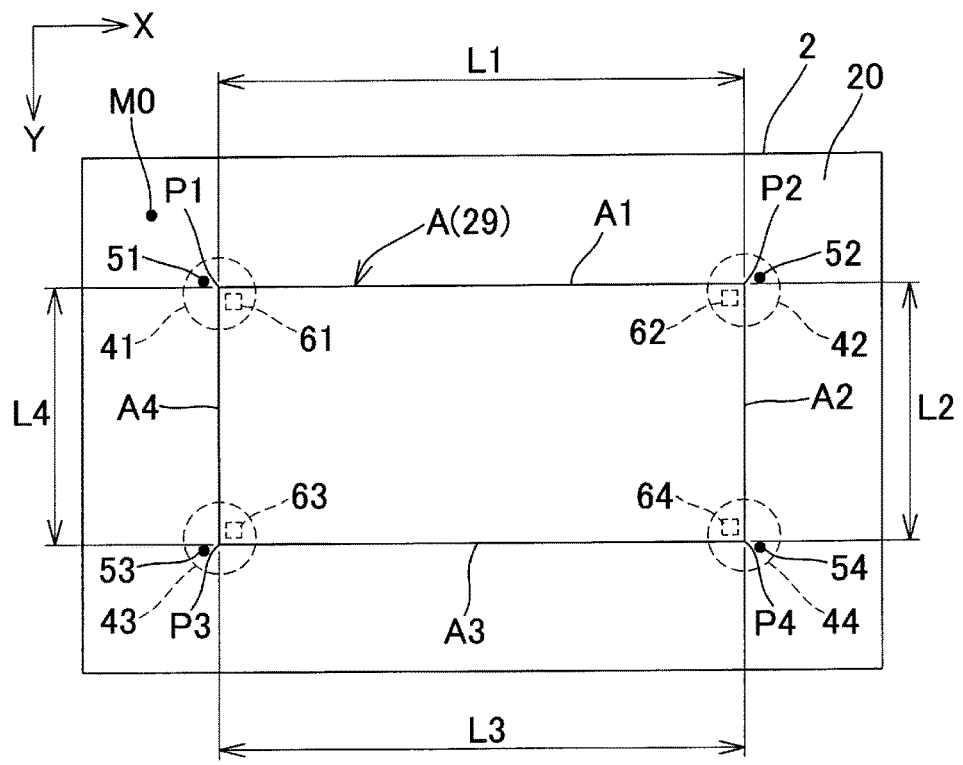
FIG. 2 is a plan view showing a state in which an electrode plate is placed in accordance with a placement region of a placement surface to measure a size of the electrode plate when seen from the upper side.

FIG. 2 is a plan view of a state in which the electrode plate A is placed in accordance with the placement region 29 of the placement surface 20 to measure the size of the electrode plate A when seen from the upper side. The electrode plate A is a substantially rectangular sheet-shaped object to be measured having four sides including sides A1, A2, A3, and A4. The sides A1, A2, A3, and A4 are measurement target portions, and lengths L1, L2, L3, and L4 of the sides A1, A2, A3, and A4 are lengths to be measured.

the two ends of the side A1 which is a measurement target portion are set as target points P1 and P2, both ends of the side A2 are set as target points P2 and P4, both ends of the side A3 are set as target points P4 and P3, and both ends of the side A4 are set as target points P1 and P3. When the corner portion of the electrode plate A is rounded, it is difficult to specify the positions of the ends of each side. Therefore, as will be described later, an intersection of extension lines of the sides A1 and A4 may be set as the target point P1, an intersection of extension lines of the sides A1 and A2 may be set as the target point P2, an intersection of extension lines of the sides A4 and A3 may be set as the target point P3, and an intersection of extension lines of the sides A2 and A3 may be set as the target point P4.

The electrode plate A has an ideal design size, and the placement region 29 is determined according to the design size of the electrode plate A. The placement surface 20 has a marking indicating the placement region 29, and thus when a user positions the electrode plate A in accordance with the marking, the first marks 51, 52, 53, and 54 and the corner portions of the electrode plate A are disposed in the imaging ranges 41, 42, 43, and 44.

Variations occur in the lengths L1 to L4 of the electrode plate A due to variations in a manufacturing process. For quality control of the electrode plate A, when the lengths L1 to L4 deviate from a predetermined range, the electrode plate A becomes a defective product. Therefore, for example, in shipment inspection of the mass-produced electrode plates A, the lengths L1 to L4 are measured using the length measurement device 1.

Figure 3:
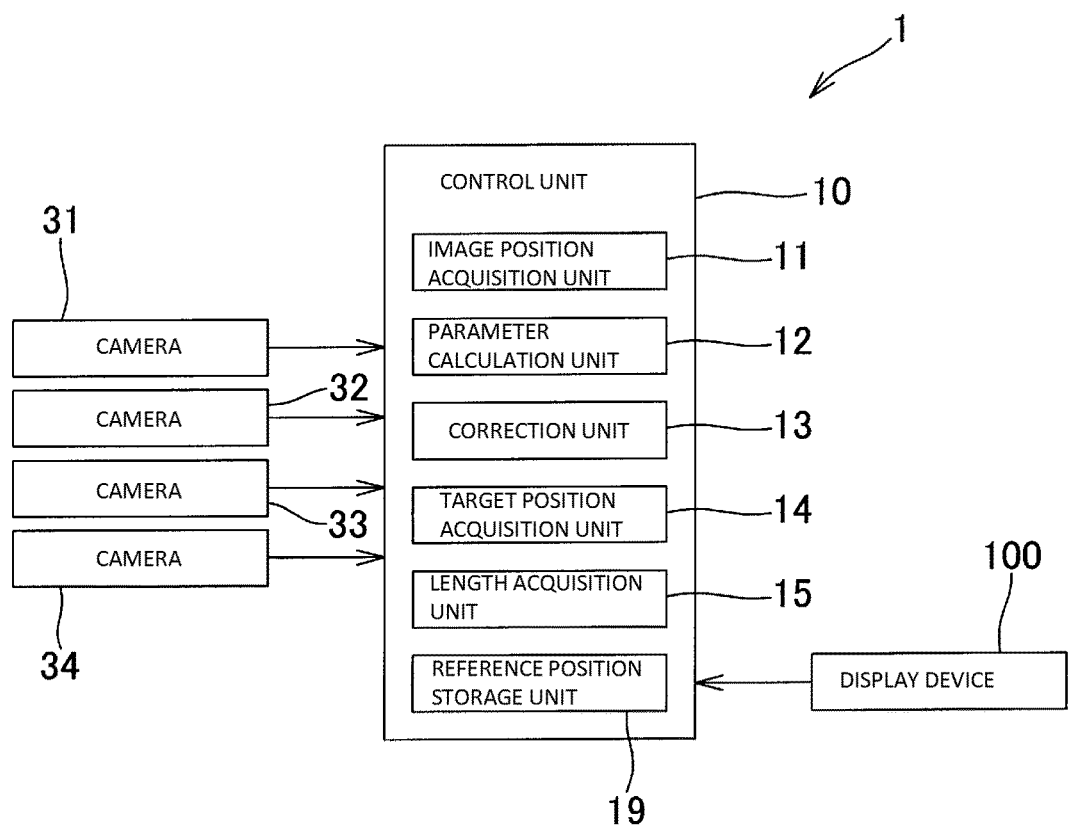
FIG. 3 is a block diagram showing an example of an electrical configuration of the length measurement device shown in FIG. 1.

FIG. 3 is a block diagram showing an example of an electrical configuration of the length measurement device 1 shown in FIG. 1. The length measurement device 1 shown in FIG. 3 includes the cameras 31 to 34, a display device 100, and a control unit 10. The cameras 31 to 34 transmit image data of the captured image to the control unit 10. For example, the display device 100 is a display device such as a liquid crystal display device or an organic electro-luminescence (EL) display device and displays an image corresponding to a signal from the control unit 10.

For example, the control unit 10 includes a central processing unit (CPU) which performs predetermined operational processing, a random access memory (RAM) which temporarily stores data, a storage unit such as a nonvolatile flash memory or a hard disk drive (HDD) which stores a predetermined control program or the like, peripheral circuits thereof and so on. The storage unit is also used as a reference position storage unit 19. Additionally, the control unit 10 serves as an image position acquisition unit 11, a parameter calculation unit 12, a correction unit 13, a target position acquisition unit 14, and a length acquisition unit 15 by executing the above-described control program.

In the reference position storage unit 19, first and second mark reference positions are stored in advance. The first mark reference positions are information indicating the positions of the first marks 51 to 54 on the placement surface 20. The second mark reference positions are information indicating the positions of the second marks 61 to 64 on the placement surface 20. Hereinafter, a position of a center of the mark is simply referred to as a position of the mark.

The first and second mark reference positions are measured in advance using a highly accurate image measurement device in a state in which the electrode plate A is not placed on the placement surface 20 and then stored in the reference position storage unit 19. For example, a highly accurate image measurement device such as one from the NEXIV (registered trademark) series manufactured by Nikon Corporation can be used as an image measurement device used for measuring the first and second mark reference positions.

The first and second mark reference positions can be represented by, for example, two-dimensional orthogonal coordinates. Specifically, for example, in FIG. 2, assuming that a center position of the origin mark M0 is an origin (0, 0) of coordinates, the first and second mark reference positions can be represented by coordinates with a right and left direction in FIG. 2 as an X axis and a vertical direction as a Y axis. A distance in the X axis direction from the origin (0, 0) can be used as a value of an X coordinate, and a distance in the Y axis direction from the origin (0, 0) can be used as a value of a Y coordinate. The unit of the distance used as the value of the coordinate is, for example, μm.

The parameter calculation unit 12 calculates a magnification parameter for correcting a deviation caused by an imaging magnification of each of the cameras 31 to 34 and an angle parameter for correcting a deviation caused by a variation in rotation angle around an axis parallel to an optical axis of each of the cameras 31 to 34 with respect to the placement surface 20.

For example, the parameter calculation unit 12 calculates the magnification parameter and the angle parameter on the basis of the first marks 51 to 54 and the second marks 61 to 64 in the captured images G1 to G4 captured by the cameras 31 to 34 in a state in which the electrode plate A is not placed on the placement surface 20.

Although the example in which the second marks 61 to 64 are formed in the placement region 29 is shown, the second marks 61 to 64 may be formed at positions outside the placement region 29 and away from the first marks 51 to 54. In this case, the parameter calculation unit 12 may calculate the magnification parameter and the angle parameter on the basis of the first marks 51 to 54 and the second marks 61 to 64 in the captured images G1 to G4 captured by the cameras 31 to 34 in a state in which the electrode plate A is placed on the placement surface 20.

First, a calculation method of the magnification parameter will be described. In the cameras 3, variations occur in the magnification of the captured image due to variations in processing accuracy of a lens or the like. Therefore, the cameras 31, 32, 33, and 34 may have different imaging magnifications in the captured images G1 to G4 from each other. As will be described later, a length of the measurement target portion, for example, a length L1 is calculated from the position of the target point P1 obtained from the captured image G1 of the camera 31 and the position of the target point P2 obtained from the captured image G2 of the camera 32. Accordingly, when the magnifications of the captured images of the respective cameras are different from each other, a deviation occurs in position information of the target points obtained from the captured images G1 to G4, and accuracy of the calculated length decreases.

Therefore, the parameter calculation unit 12 corrects the variations in imaging magnifications of the respective cameras and generates magnification parameters for matching the position information in each of the captured images G1 to G4 with the position information in the placement surface 20.

Figure 4:
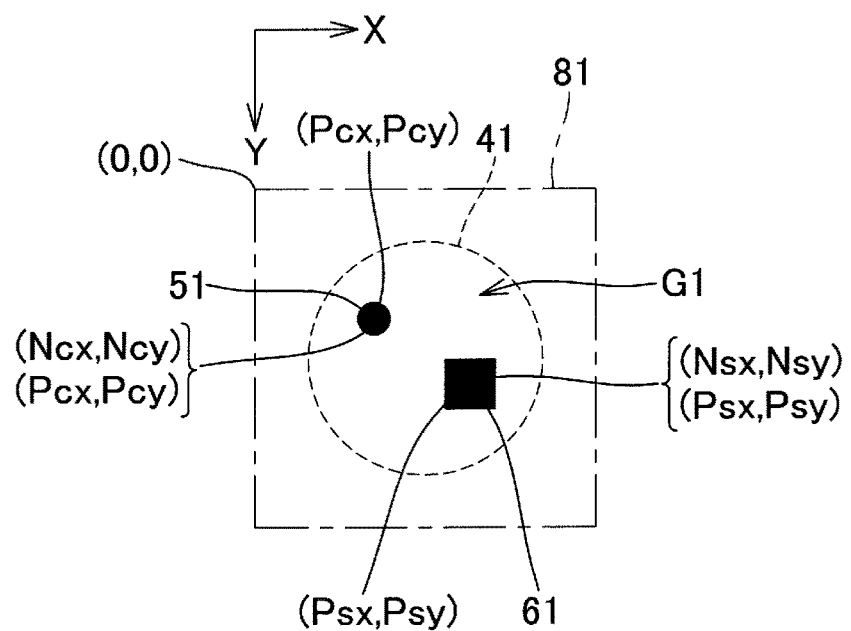
FIG. 4 is an explanatory diagram showing a captured image captured by a camera in a state in which the electrode plate is not placed on the placement surface.

FIG. 4 is an explanatory diagram showing the captured image G1 captured by the camera 31 in the state in which the electrode plate A is not placed on the placement surface 20. The image captured by the camera 31 is represented by image data 81 generated by a CCD or the like. The image data 81 is formed by arranging a plurality of pixels in a roughly grid pattern. A position of the image on the image data 81 is represented by the number of pixels in the X direction and the number of pixels in the Y direction from the origin, for example, with the pixel at an upper left corner of the image data 81 as the origin (0, 0). Hereinafter, the coordinates in which the positions in the captured image are represented by such pixel numbers are referred to as pixel coordinates.

The parameter calculation unit 12 acquires the pixel coordinates of the center position of the first mark 51 in the image data 81 as (Pcx, Pcy) and acquires the pixel coordinates of the center position of the second mark 61 in the image data 81 as (Psx, Psy) from the image data 81. The parameter calculation unit 12 calculates a distance L between the first mark 51 and the second mark 61 on the placement surface 20 on the basis of the first and second mark reference positions stored in the reference position storage unit 19.

Since the first and second mark reference positions are represented by coordinates in the unit μm, assuming that the first mark reference position of the first mark 51 is (Ncx, Ncy) and the second mark reference position of the second mark 61 is (Nsx, Nsy), the distance L (μm) is obtained by the following Equation (1).

[Math. 1]

$$L = \sqrt{(Ncx-Nsx)^2 + (Ncy-Nsy)^2} \qquad (1)$$

The distance L corresponds to the distance between the first mark 51 and the second mark 61 in the captured image G1, that is, a distance Lp between the pixel coordinates (Pcx, Pcy) and the pixel coordinates (Psx, Psy). The distance Lp is obtained by the following Equation (2).

[Math. 2]

$$Lp = \sqrt{(Pcx-Psx)^2 + (Pcy-Psy)^2} \qquad (2)$$

Since the distance Lp in the pixel coordinates corresponds to the actual distance L, The magnification parameter D (μm/pixel) which is a distance per one pixel in the pixel coordinates, that is, a pixel spacing is obtained by the following Equation (3).

[Math. 3]

$$D = \sqrt{\frac{(Ncx - Nsx)^2 + (Ncy - Nsy)^2}{(Pcx - Psx)^2 + (Pcy - Psy)^2}} \tag{3}$$

The parameter calculation unit 12 calculates the magnification parameter D (μm/pixel) as the magnification parameter for the camera 31 (the captured image G1) using Equation (3).

Since the distance L (μm) between the first mark and the second mark can be obtained from the first mark reference position (Ncx, Ncy) and the second mark reference position (Nsx, Nsy), the first mark reference position (Ncx, Ncy) and the second mark reference position (Nsx, Nsy) correspond to an example of information indicating (indirectly) the distance L between the first mark and the second mark on the placement surface 20. The distance L may be stored in the reference position storage unit 19, and the parameter calculation unit 12 may calculate the magnification parameter D (μm/pixel) on the basis of the distance between the first mark 51 and the second mark 61 in the captured image G1 and the distance L.

In the same way as that in the magnification parameter D for the camera 31 (the captured image G1), the parameter calculation unit 12 also acquires the pixel coordinates of the first marks 52 to 54 in the image data 82 to 84 as (Pcx, Pcy) sequentially with respect to the magnification parameters D for the cameras 32 to 34 (the captured images G2 to G4), sequentially acquires the pixel coordinates of the second marks 62 to 64 in the image data 82 to 84 as (Psx, Psy), reads the coordinates of the first mark reference positions of the first marks 52 to 54 from the reference position storage unit 19 sequentially as (Ncx, Ncy) and reads the coordinates of the second mark reference positions of the second marks 62 to 64 from the reference position storage unit 19 sequentially as (Nsx, Nsy). Then, the parameter calculation unit 12 calculates the magnification parameters D for the cameras 32 to 34 (the captured images G2 to G4) using Equation (3). The parameter calculation unit 12 stores the magnification parameters D corresponding to the thus obtained cameras 31 to 34 (the captured images G1 to G4) in the storage unit.

The magnification parameters D corresponding to the cameras 31 to 34 are parameters for converting the number of pixels in the captured images G1 to G4 into an actual distance on the basis of a relationship between a distance based on the number of pixels of the first mark and the second mark in the image actually captured by the cameras 31 to 34 and an actual distance on the placement surface 20. Therefore, a deviation of the length or the position due to the imaging magnification of the captured images G1 to G4 can be corrected by converting the number of pixels or the pixel coordinates obtained by the captured images G1 to G4 into the length (μm) or the coordinates based on the length (μm) on the basis of the magnification parameter.

Since the same processing is performed for the positions of the first marks 51 to 54 corresponding to the captured images G1 to G4 captured by the cameras 31 to 34 and the positions of the second marks 61 to 64 in the image data 81 to 84, the processing performed correspondingly to the captured images G1 to G4 captured by the cameras 31 to 34 will be described below by writing the first marks 5 and the second marks 6 which are generic terms, the reference positions of the first marks 51 to 54 are also simply referred to as first mark reference positions (Ncx, Ncy), and the reference positions of the second marks 61 to 64 are simply referred to as second mark reference positions (Nsx, Nsy) to simplify the explanation.

The correction unit 13 calculates coordinates (Ccx, Ccy) for the pixel coordinates (Pcx, Pcy) of the first marks 5 in the captured images G1 to G4 using the following Equation (4) on the basis of the magnification parameter D and stores the coordinates (Ccx, Ccy) in the storage unit as the coordinates of the corrected first marks 5.

$$Ccx = Pcx \times D, Ccy = Pcy \times D \tag{4}$$

Also, the correction unit 13 calculates coordinates (Csx, Csy) for the pixel coordinates (Psx, Psy) of the second marks 6 based on the magnification parameter D using the following Equation (5) and stores the coordinates (Csx, Csy) in the storage unit as the corrected coordinates of the second marks 6.

$$Csx = Psx \times D, Csy = Psy \times D \tag{5}$$

Next, a method of calculating the angle parameter will be described. In the case that the cameras 31 to 34 are rotated and mounted around optical axes thereof or axes parallel to the optical axes thereof, or the cameras 31 to 34 are rotated with time due to vibration or the like when the length measurement device 1 is assembled, the captured images G1 to G4 of the cameras 31 to 34 also become images rotated with respect to the placement surface 20. The parameter calculation unit 12 calculates an angle parameter for correcting a deviation of the captured images G1 to G4 caused by rotation angles of the cameras 31 to 34. Specifically, the parameter calculation unit 12 calculates rotation angles of the cameras 31 to 34 (the captured images G1 to G4) with respect to a coordinate axis of the placement surface 20 as angle parameters R.

Specifically, the parameter calculation unit 12 calculates an angle Rn of an inclination of a straight line connecting the first mark 5 and the second mark 6 on the placement surface 20 based on the first mark reference position (Ncx, Ncy) and the second mark reference position (Nsx, Nsy) using the following Equation (6).

$$Rn = \arctan\{(Nsy - Ncy)/(Nsx - Ncx)\} \tag{6}$$

Next, the parameter calculation unit 12 calculates an angle Rc of an inclination of a straight line connecting the first mark 5 and the second mark 6 on the captured image based on the coordinates (Ccx, Ccy) of the corrected first marks 5 and the coordinates (Csx, Csy) of the corrected second marks 6 on the captured image using the following Equation (7).

$$Rc = \arctan\{(Csy - Ccy)/(Csx - Ccx)\} \tag{7}$$

Next, the parameter calculation unit 12 calculates the rotation angle of the cameras 3 with respect to the placement surface 20 as the angle parameter R using the following Equation (8).

$$\text{Angle parameter } R = Rc - Rn \tag{8}$$

The parameter calculating unit 12 is not limited to the example of calculating the magnification parameter D and the angle parameter R. The parameter calculation unit 12 may have a configuration which calculates either the magnification parameter D or the angle parameter R. Further, the configuration may be such that the parameter calculation unit 12 and the correction unit 13 are not provided.

The image position acquisition unit 11 performs an image position acquisition process of acquiring coordinates (u, v) of the target image positions which are the positions of the target points P1 to P4 in the captured images G1 to G4 and the pixel coordinates of the first mark image position which is the position of each of the first marks (Pcx, Pcy) on the basis of the captured images G1 to G4 captured by the respective cameras 3 when the electrode plate A is placed on the placement region 29 of the placement surface 20. Hereinafter, the coordinates (u, v) of the target image position may be simply referred to as a target image position (u, v), and the pixel coordinates (Pcx, Pcy) of the first mark image position may be simply referred to as a first mark image position (Pcx, Pcy).

Figure 5:
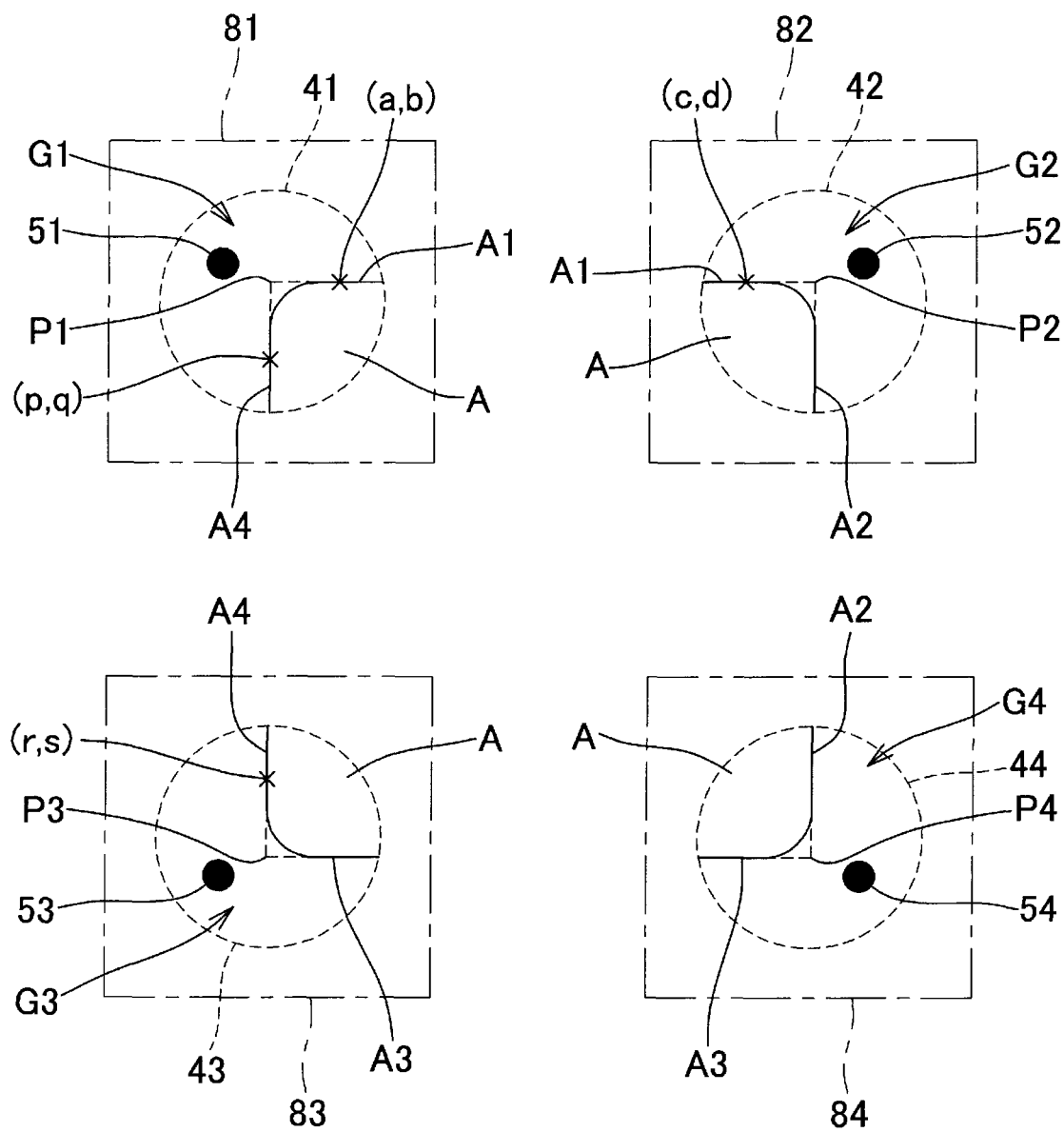
FIG. 5 is an explanatory diagram showing an example of the captured image captured by the camera in a state in which the electrode plate is placed on the placement region.

FIG. 5 is an explanatory diagram showing an example of the captured images G1 to G4 captured by the cameras 31 to 34 in the state in which the electrode plate A is placed on the placement region 29.

The image position acquisition unit 11 acquires the target image positions which are the positions of the target points P1 to P4, for example, as follows. The target points P1 to P4 are apexes (four corners) of the electrode plate A, but the corner of the electrode plate A may be missing due to being rounded or the like as shown in FIG. 5 when seen in units of μm. In this case, it is difficult to specify positions of both ends of the measurement target portion of the electrode plate A. Therefore, the image position acquisition unit 11 acquires points at which extension lines of the four sides A1 to A4 intersect each other as target image positions that are the positions of the target points P1 to P4 in the respective captured images G1 to G4.

Specifically, when the target image position (u, v) of the target point P1 is acquired, the image position acquisition unit 11 acquires coordinates (a, b) of one point on the side A1 in the captured image G1, coordinates (c, d) of one point on the side A1 in the captured image G2, coordinates (p, q) of one point on the side A4 in the captured image G1, and coordinates (r, s) of one point on the side A4 in the captured image G3 and calculates the target image position (u, v) of the target point P1 using the following Equation (9).

$$u=(ak_{ab}-pk_{pq}-b+q)/(k_{ab}-k_{pq})$$

$$v=k_{ab}(u-a)+b \qquad (9)$$

However, $k_{ab}=(b-d)/(a-c), k_{pq}=(q-s)/(p-r)$

The target image positions of the target points P2 to P4 can also be obtained in the same way as the target point P1. Thus, the target image positions of the target points P1 to P4 can be accurately acquired even when the apexes of the electrode plate A are missing.

The electrode plate is not limited to a rectangular shape and may have a polygonal shape having three or more sides. Additionally, the image position acquisition unit 11 may acquire points at which the extension lines of the plurality of sides intersect each other as the target image positions which are the positions of the target points in each of the captured images.

Further, the image position acquisition unit 11 is not limited to the example in which the points at which the extension lines of the sides A1 to A4 intersect each other are acquired as the target image positions. The image position acquisition unit 11 may acquire an apex position of the image of the electrode plate A as the target image position.

The correction unit 13 corrects the target image position (u, v) of the target points P1 to P4 and the pixel coordinates (Pcx, Pcy) of each of the first mark image positions in the captured images G1 to G4 acquired by the image position acquisition unit 11 in the state in which the electrode plate A is placed on the basis of the magnification parameters D and the angle parameters R.

Specifically, the correction unit 13 first calculates the coordinates (Ccx, Ccy) for the pixel coordinates (Pcx, Pcy) of the first marks 5 acquired by the image position acquisition unit 11 on the basis of the magnification parameters D using Equation (4) and then stores the coordinates (Ccx, Ccy) in the storage unit as the coordinates of the first mark image position. Further, the correction unit 13 calculates coordinates (x, y) for each of the target image positions (u, v) of the target points P1 to P4 acquired by the image position acquisition unit 11 using the following Equation (10) and then stores the coordinates (x, y) in the storage unit as the target image position (x, y) of each of the target points P1 to P4.

$$x=u\times D, y=v\times D \qquad (10)$$

Accordingly, an imaging magnification correction is performed for each of the first mark image positions and the target image position of each of the target points P1 to P4.

Next, the correction unit 13 rotates the coordinates (Ccx, Ccy) of each of the first mark image positions and each of the target image positions (x, y) by an angle indicated by the angle parameter R and then stores the obtained coordinates in the storage unit as the coordinates (Ccx, Ccy) of each of the corrected first mark image positions and each of the target image positions (x, y) of the corrected target points P1 to P4.

The target position acquisition unit 14 obtains position coordinates (Ax, Ay) of each of the target points P1 to P4 on the placement surface 20 on the basis of each of the corrected target image positions (x, y), each of the corrected first mark image positions (Ccx, Ccy) for position measurement and each of the first mark reference positions (Ncx, Ncy), which is the position of each of the first marks on the placement surface 20, corresponding to each of the captured Specifically, the target position acquisition unit 14 acquires the position coordinates (Ax, Ay) of the target points P1 to P4 corresponding to each of the cameras 31 to 34 (the captured images G1 to G4)) on the basis of the following Equations (11) and (12).

$$Ax=x-Ccx+Ncx \qquad (11)$$

$$Ay=y-Ccy+Ncy \qquad (12)$$

The length acquisition unit 15 calculates the lengths L1 to L4 of the length measurement target portion on the basis of the positions of the target points P1 to P4 obtained by the target position acquisition unit 14. Specifically, when the position coordinates of the target point P1 are (Ax1, Ay1), the position coordinates of the target point P2 are (Ax2, Ay2), the position coordinates of the target point P3 are (Ax3, Ay3), and the position coordinates of the target point P4 are (Ax4, Ay4), the lengths L1 to L4 are obtained by the following Equations (13).

[Math. 4]

$$L1=\sqrt{(Ax1-Ax2)^2+(Ay1-Ay2)^2}$$

$$L2=\sqrt{(Ax2-Ax4)^2+(Ay2-Ay4)^2}$$

$$L3=\sqrt{(Ax3-Ax4)^2+(Ay3-Ay4)^2}$$

$$L4=\sqrt{(Ax1-Ax3)^2+(Ay1-Ay3)^2} \qquad (13)$$

Figure 6:
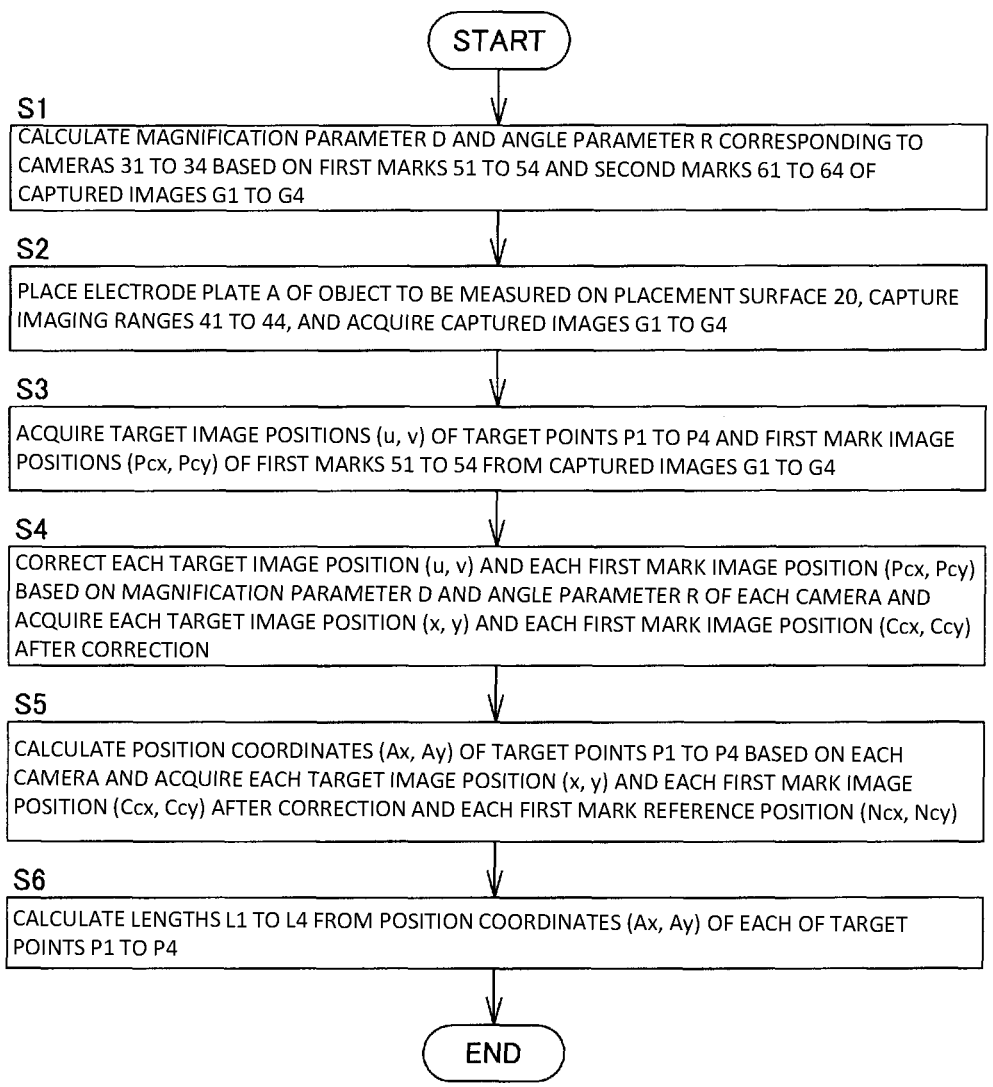
FIG. 6 is a flowchart showing an example of an operation of the length measurement device shown in FIG. 1.

FIG. 6 is a flowchart showing an example of the operation of the length measuring apparatus 1 shown in FIG. 1. First, in the state in which the electrode plate A is not placed on the placement surface 20, the parameter calculation unit 12 calculates the magnification parameter D and the angle parameter R corresponding to the cameras 31 to 34 on the basis of the first marks 51 to 54 and the second marks 61 to 64 of the captured images G1 to G4 (Step S1).

Next, after the user positions the electrode plate A to be measured on the placement surface 20 to start measurement of the electrode plate A (refer to FIG. 2), the imaging ranges 41 to 44 are captured by the cameras 31 to 34, and the captured images G1 to G4 are acquired (Step S2). In this case, since the cameras 31 to 34 corresponding to the target points P1 to P4 are provided, there is no need to move the camera as in the background art. As a result, a measurement time of the lengths L1 to L4 can be shortened, and deterioration of the measurement accuracy according to movement of the cameras does not occur.

Next, the target positions (u, v) of the target points P1 to P4 and the first mark image positions (Pcx, Pcy) of the first marks 51 to 54 are acquired from the captured images G1 to G4 by the image position acquisition unit 11 (Step S3).

Next, the target image positions (u, v) and the first mark image positions (Pcx, Pcy) are corrected by the correction unit 13 on the basis of the magnification parameters D and the angle parameters R, and each of the corrected target image positions (x, y) and each of the corrected first mark image positions (Ccx, Ccy) are calculated (Step S4).

Next, the position coordinates (Ax, Ay) of the target points P1 to P4 on the placement surface 20 are calculated by the target position acquisition unit 14 on the basis of each of the corrected target image positions (x, y) and each of the corrected first mark image positions (Ccx, Ccy) and each of the first mark reference positions (Ncx, Ncy) (Step S5).

Next, the lengths L1 to L4 of the object to be measured are calculated from the position coordinates (Ax, Ay) of the target points P1 to P4 by the length acquisition unit 15 (Step S6).

As described above, according to the processing of steps S1 to S6, since a time for moving the camera is unnecessary and deterioration of the accuracy due to the movement of the camera does not occur even when a length of an object to be measured having a large size is measured, it is possible to shorten the measurement time while improving the measurement accuracy.

Further, in the target position acquisition unit 14 (Step S5), the position coordinates (Ax, Ay) of the target points P1 to P4 are calculated on the basis of the positional relationship between each of the target image positions (x, y) and each of the first mark image positions (Ccx, Ccy) obtained by the cameras 31 to 34 with reference to each of the first mark reference positions (Ncx, Ncy) obtained by measurement with a highly accurate image measurement device in advance. Therefore, when the electrode plate A is measured with the length measurement device 1 in a mass production process or the like, it is unnecessary to use a highly accurate image measurement device which is expensive and has a long measurement time, and it is possible to shorten the measurement time while improving the measurement accuracy.

Furthermore, since the imaging magnification and the mounting angle of the cameras 31 to 34 are corrected by the parameter calculation unit 12 and the correction unit 13, the measurement accuracy of the lengths L1 to L4 is improved.

Second Embodiment

Figure 7:
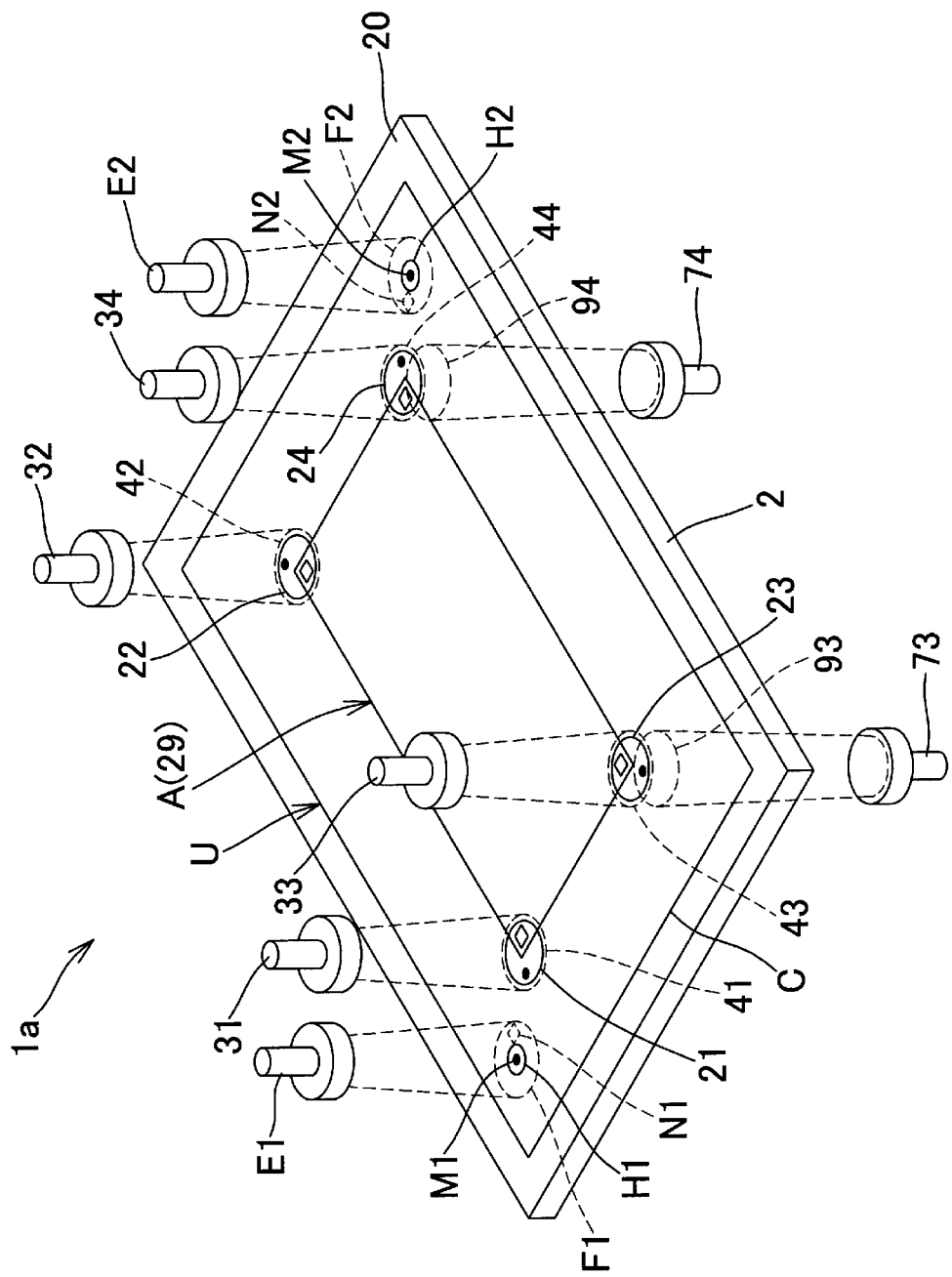
FIG. 7 is a conceptual diagram schematically showing an example of a configuration of a length measurement device according to a second embodiment of the present invention.
Figure 8:
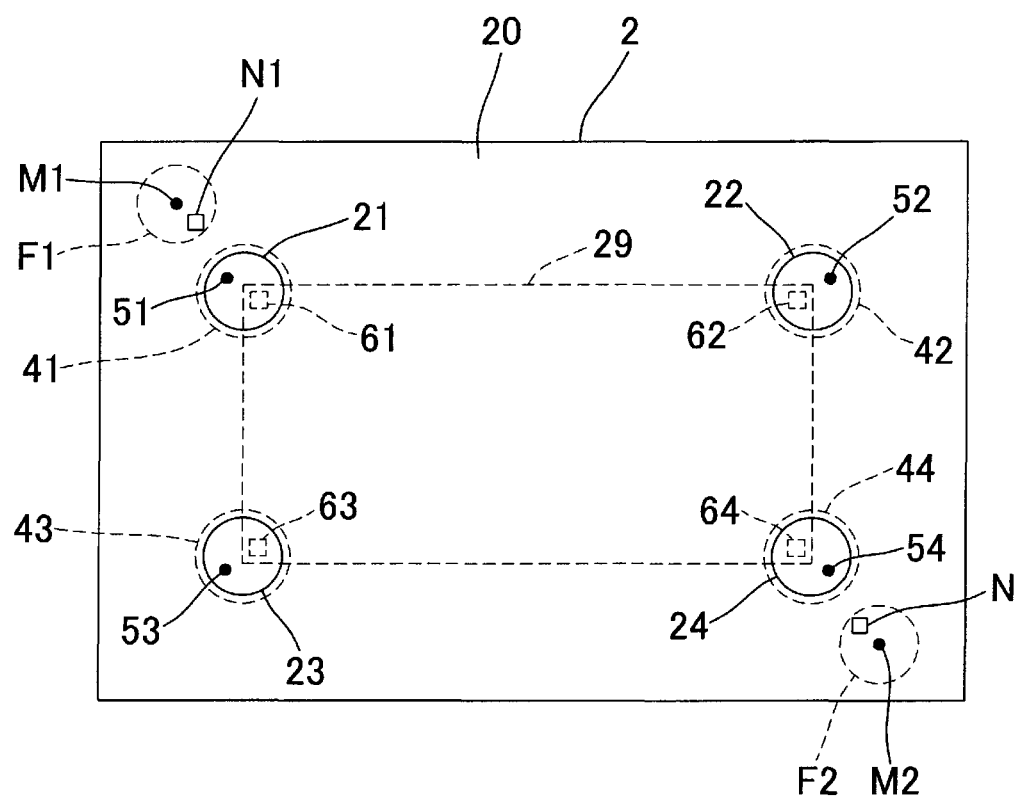
FIG. 8 is a plan view of the placement surface of the length measurement device shown in FIG. 7 when seen from the upper side.
Figure 9:
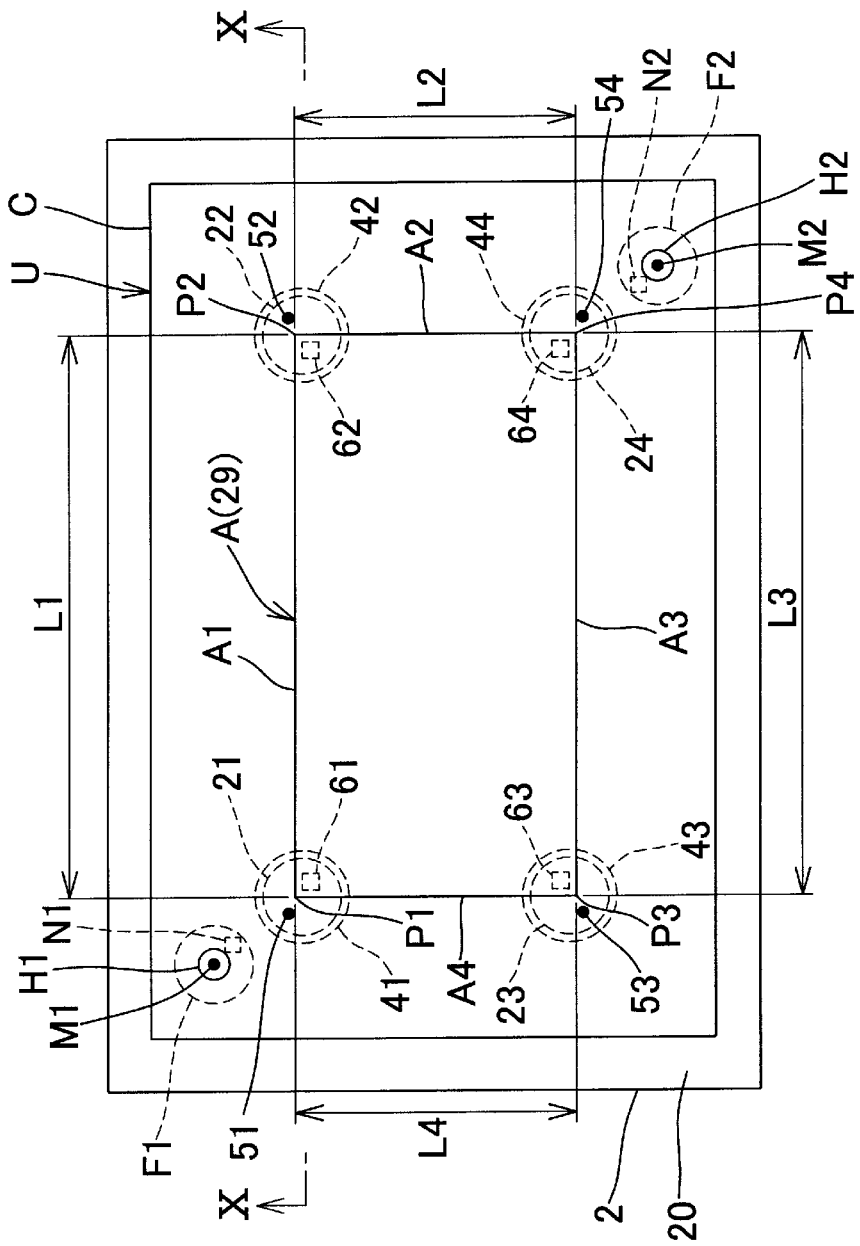
FIG. 9 is a plan view showing a state in which an electrode unit is placed on the placement surface of the length measurement device shown in FIG. 7 when seen from the upper side.
Figure 10:
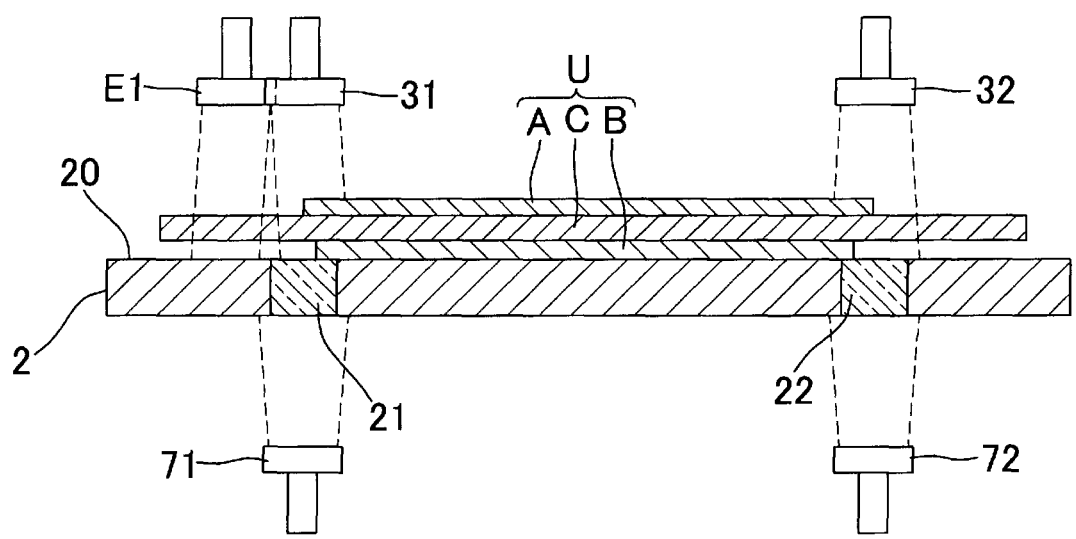
FIG. 10 is a cross-sectional view taken along line X-X in FIG. 9.
Figure 11:
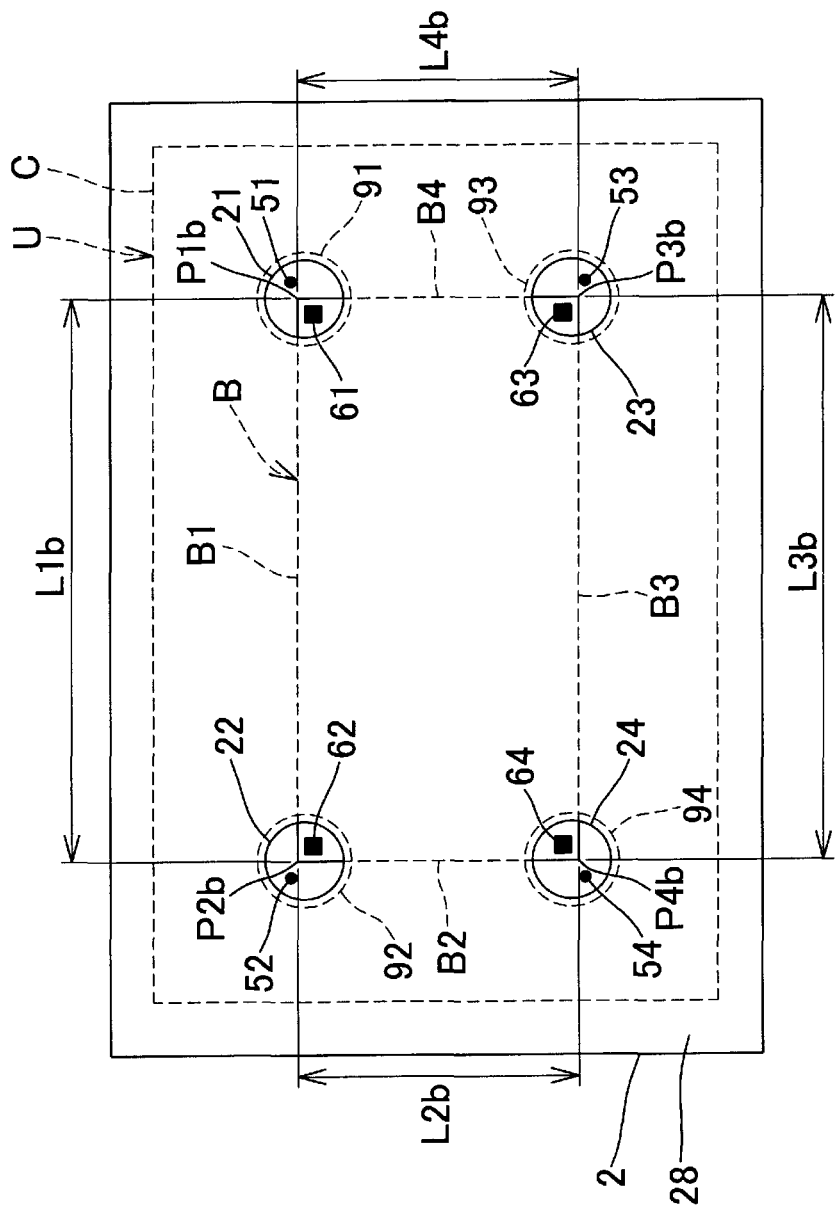
FIG. 11 is a bottom view of a rear surface of a placement table shown in FIG. 7 when seen from the lower side of the placement table.

Next, a length measuring apparatus 1a according to a second embodiment of the present invention will be described. FIG. 7 is a conceptual diagram schematically showing an example of a configuration of a length measurement device 1a according to a second embodiment of the present invention. FIG. 8 is a plan view of a placement surface 20 of the length measurement 1a device shown in FIG. 7 when seen from the upper side. FIG. 9 is a plan view showing a state in which an electrode unit U is placed on the placement surface 20 of the length measurement device 1a shown in FIG. 7 when seen from the upper side. FIG. 10 is a cross-sectional view taken along line X-X in FIG. 9. FIG. 11 is a bottom view of a rear surface 28 of a placement table 2 shown in FIG. 7 when seen from the lower side of the placement table 2.

The length measurement device 1a shown in FIG. 7 is different from the length measurement device 1 shown in FIG. 1 in the following points. That is, the length measurement device 1a is different from the length measurement device 1 in that cameras 71, 72, 73, and 74 (a second imaging unit) and cameras E1 and E2 (a third imaging unit) are further included, transparent windows 21, 22, 23, and 24 (transparent regions) are installed at positions corresponding to the imaging ranges 41, 42, 43, and 44 on the placement table 2, and third marks M1 and M2 and fourth marks N1 and N2 are formed on the placement surface 20. Further, a control unit 10a which will be described later further includes a hole position acquisition unit 16 and an object angle acquisition unit 17, and operations of an image position acquisition unit 11a, a parameter calculation unit 12a, a correction unit 13a, a target position acquisition unit 14a, and a length acquisition unit 15a are different (refer to FIG. 12).

Since the other configuration of the length measurement device 1a is substantially the same as that of the length measurement device 1, characteristic points of the length measurement device 1a will be described below.

The length measurement device 1a is suitable for measurement of the electrode plates A and B formed on the electrode unit U for a fuel cell. Referring to FIGS. 9 and 10, the electrode unit U is configured by forming substantially rectangular electrode plates A and B formed on both surfaces of a substantially rectangular sheet C to face each other with a gap from a peripheral edge of the sheet C. One of the electrode plates A and B is a fuel electrode, and the other one is an air electrode. A fuel cell is formed by stacking a plurality of electrode units U.

The sheet C is formed of a transparent resin material or the like. Circular positioning holes H1 and H2 passing through the sheet C are formed at substantially diagonal positions of the sheet C. When a plurality of electrode units U are stacked to assemble a fuel cell, the plurality of electrode units U are accurately aligned and stacked by inserting a rod-shaped member through the positioning holes H1 and H2. For example, the positioning holes H1 and H2 have a diameter of about 4 mm.

When the electrode unit U is placed on the placement surface 20 so that the electrode plates A and B are aligned with the placement region 29, the first marks 51 to 54 are covered with the transparent sheet C. The cameras 31 to 34 capture the first marks 51 to 54 through the transparent sheet C.

In design, the electrode plates A and B have the same shape at the same position on both sides of the sheet C, differences in position and shape are generated slightly due to manufacturing variations or the like.

Referring to FIG. 11, like the electrode plate A, the electrode plate B is a substantially rectangular sheet-shaped object to be measured having four sides including sides B1, B2, B3, and B4. The sides B1, B2, B3, and B4 are the measurement target portions, and lengths L1b, L2b, L3b, and L4b of the sides B1, B2, B3, and B4 are lengths to be measured.

Both ends of the side B1 which is the measurement target portion are set as target points P1b and P2b, both ends of the side B2 are set as target points P2b and P4b, both ends of the side B3 are set as target points P4b and P3b, and both ends of the side B4 are set as target points P1b and P3b. As in the case of the target points P1 to P4, an intersection of extension lines of the sides B1 and B4 may be set as the target point P1b, an intersection of extension lines of the sides B1 and B2 may be set as the target point P2b, an intersection of extension lines of the sides B4 and B3 may be set as the target point P3b, and an intersection of extension lines of the sides B2 and B3 may be set as the target point P4b.

The length measurement device 1a measures the lengths L1 to L4 of the sides A1 to A4 of the electrode plate A and the lengths L1b to L4b of the sides B1 to B4 of the electrode plate B formed in the electrode unit U.

Referring to FIG. 9, the third marks M1 and M2 are disposed to be located inside the positioning holes H1 and H2 when the electrode unit U is placed on the placement surface 20 to align the electrode plates A and B with the placement region 29. Like the origin mark M0, the third mark M1 is formed in the vicinity of a corner portion of the placement surface 20, for example, in the vicinity of an upper left corner and is set as an origin of the position coordinates set on the placement surface 20. The fourth marks N1 and N2 are formed at positions separated from the third marks M1 and M2.

Referring to FIG. 7, the cameras E1 and E2 are disposed above the placement surface 20. The cameras E1 and E2 capture hole imaging regions F1 and F2 including the third marks M1 and M2, the positioning holes H1 and H2 of the electrode unit U placed on the placement surface 20 and the fourth marks N1 and N2.

The transparent windows 21 to 24 are formed of a transparent member such as glass or a resin, for example. The transparent windows 21 to 24 transmit light to a front and a back of the placement table 2 in the imaging ranges 41 to 44. The first marks 51 to 54 and second marks 61 to 64 are formed on a surface of each of the transparent windows 21 to 24 on the side of the placement surface 20. For example, the entire placement table 2 may be formed of a transparent member such as glass, and a region corresponding to the imaging ranges 41 to 44 may be a transparent region.

The cameras 71 to 74 are disposed below the placement table 2 to face a back surface of the placement table 2 on the side opposite to the placement surface 20.

Referring to FIG. 11, the cameras 71, 72, 73, and 74 are respectively provided to correspond to the transparent windows 21, 22, 23, and 24 and takes images of the imaging ranges 91, 92, 93, and 94 including the transparent windows 21, 22, 23, and 24. The cameras 71 to 74 image the first marks 51 to 54, the second marks 61 to 64, and the target points P1b to P4b from the back surface of the placement table 2 via the transparent windows 21 to 24.

Figure 12:
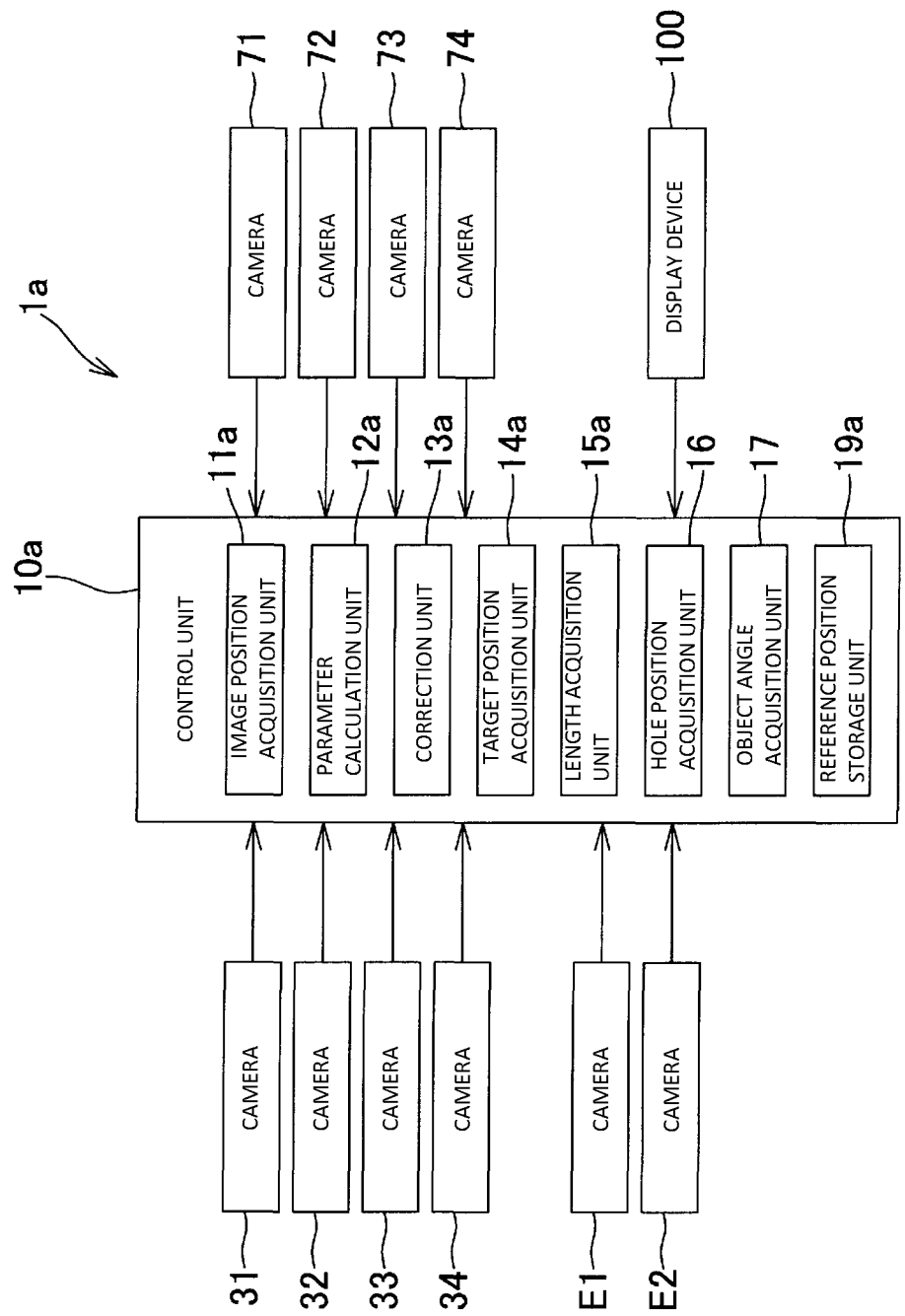
FIG. 12 is a block diagram showing an example of the electrical configuration of the length measurement device shown in FIG. 7.

FIG. 12 is a block diagram showing an example of an electrical configuration of the length measurement device 1a shown in FIG. 7. In the length measurement device 1a shown in FIG. 12, the cameras E1 and E2 and the cameras 71 to 74 are connected to the control unit 10a in addition to the configuration of the length measurement device 1. The control unit 10a serves as an image position acquisition unit 11a, a parameter calculation unit 12a, a correction unit 13a, a target position acquisition unit 14a, a length acquisition unit 15a, a hole position acquisition unit 16, an object angle acquisition unit 17, and a reference position storage unit 19a.

Like the first and second mark reference positions, a third mark reference position indicating positions of the third marks M1 and M2 on the placement surface 20 and a fourth mark reference position indicating positions of the fourth marks N1 and N2 on the placement surface 20 are measured by the highly accurate image measurement device and then stored in the reference position storage unit 19a in advance in addition to the first and second mark reference positions.

In addition to the processing of the parameter calculation unit 12, the parameter calculation unit 12a calculates a magnification parameter for correcting a deviation caused by the imaging magnification of the cameras 71 to 74 and the cameras E1 and E2, and an angle parameter for correcting a deviation caused by a variation in rotation angle around an axis parallel to each of optical axes of the cameras 71 to 74 and the cameras E1 and E2.

Specifically, the parameter calculation unit 12a calculates the magnification parameter D corresponding to the cameras 71 to 74 using Equation (3) on the basis of the first mark reference position (Ncx, Ncy) of the first marks 51 to 54, the second mark reference position (Nsx, Nsy) of the second marks 61 to 64 stored in the reference position storage unit 19a and the pixel coordinates of the first marks 51 to 54 and the second marks 61 to 64 obtained from a captured image captured by the cameras 71 to 74.

Further, the parameter calculation unit 12a sets the coordinates of the third mark reference position of the third marks M1 and M2 stored in the reference position storage unit 19a as (Ncx, Ncy), sets the coordinates of the fourth mark reference position of the fourth marks N1 and N2 stored in the reference position storage unit 19a as (Nsx, Nsy), sets the pixel coordinates of the third mark M1 and M2 captured by the cameras E1 and E2 as (Pcx, Pcy), sets the pixel coordinates of the fourth marks N1 and N2 captured by the cameras E1 and E2 as (Psx, Psy) and then calculates the magnification parameter D corresponding to the cameras E1 and E2 using Equation (3).

In addition to the processing of the correction unit 13, the correction unit 13a corrects the coordinates of the first marks 5 and the second marks 6 captured by the cameras 71 to 74 and the coordinates of the third marks M1 and M2 and the fourth marks N1 and N2 captured by the cameras E1 and E2 using Equations (4) and (5) and stores the corrected coordinates (Ccx, Ccy) and (Csx, Csy) in the storage unit as coordinates for parameter calculation.

In addition to the processing of the parameter calculation unit 12, the parameter calculation unit 12a calculates the angle parameter R corresponding to the cameras 71 to 74 using Equations (6), (7) and (8) on the basis of the first mark reference position (Ncx, Ncy) of the first marks 51 to 54 and the second mark reference position (Nsx, Nsy) of the second marks 61 to 64 stored in the reference position storage unit 19a, and the corrected coordinates (Ccx, Ccy) and (Csx, Csy) for parameter calculation of the first marks 5 and the second marks 6 captured by the cameras 71 to 74.

The parameter calculation unit 12a also calculates the angle parameter R corresponding to the cameras E1 and E2 using Equations (6), (7) and (8) on the basis of the third mark reference position (Ncx, Ncy) and the fourth mark reference position (Nsx, Nsy) stored in the reference position storage unit 19a, and the corrected coordinates (Ccx, Ccy) and (Csx, Csy) for parameter calculation of the third marks M1 and M2 and the fourth marks N1 and N2 captured by the cameras E1 and E2.

The parameter calculation unit 12a is not limited to the example in which the magnification parameter D and the angle parameter R are calculated. The parameter calculation unit 12a may have a configuration which calculates either the magnification parameter D or the angle parameter R. Further, the configuration may be such that the parameter calculation unit 12a and the correction unit 13a are not provided.

In addition to the processing of the image position acquisition unit 11, the image position acquisition unit 11a acquires each of the target image positions (u, v) of the target points P1b to P4b of the electrode plate B and each of the first mark image positions (Pcx, Pcy) on the basis of the captured images of the cameras 71 to 74 when the electrode unit U is placed on the placement surface 20. The image position acquisition unit 11a acquires each of the target image positions (u, v) of the target points P1b to P4b of the electrode plate B on the basis of the captured images of the cameras 71 to 74 by processing similar to the acquisition of the positions of the target points P1 to P4.

Further, the image position acquisition unit 11a acquires the pixel coordinates (u, v) of the center positions of the positioning holes H1 and H2 (hereinafter, simply referred to as the positions of the positioning holes H1 and H2) and each of the pixel coordinate (Pcx, Pcy) of center positions of the third mark M1, M2 (hereinafter, simply referred to as the positions of the third marks M1 and M2) in each of the captured images on the basis of the images captured by the cameras E1 and E2 when the electrode unit U is placed on the placement surface 20.

The correction unit 13a corrects the pixel coordinates (Pcx, Pcy) of each of the first mark image positions acquired by the image position acquisition unit 11a from the captured images in the state in which the electrode unit U is placed on the basis of the magnification parameter D corresponding to each of the cameras (the captured images) using Equation (4) and stores the corrected coordinates (Ccx, Ccy) in the storage unit as coordinates of each of the corrected first mark image positions for position measurement.

Further, the correction unit 13a calculates each of the coordinates (x, y) of the target image positions (u, v) of the target points P1 to P4 and P1b to P4b acquired by the image position acquisition unit 11a from the captured images in the state in which the electrode unit U is placed using Equation (10) and stores the coordinates (x, y) in the storage unit as the target image position (x, y) of each of the target points P1 to P4 and P1b to P4b.

Accordingly, the imaging magnification correction for each of the first mark image positions and each of the target image positions of the target points P1 to P4 and P1b to P4b in the captured images of the cameras 31 to 34 and the cameras 71 to 74 is performed.

Further, the correction unit 13a corrects the pixel coordinates (Pcx, Pcy) of the third mark M1 and the pixel coordinates (u, v) of the positioning hole H1 corresponding to the camera E1 on the basis of the magnification parameter D of the camera E1 using Equation (4) and Equation (10) and stores the corrected coordinates (Ccx, Ccy) and coordinates (x, y) in the storage unit as the position coordinates of the third mark M1 and the positioning hole H1 of the magnification-corrected camera E1.

Similarly, the correction unit 13a corrects the pixel coordinates (Pcx, Pcy) of the third mark M2 and the pixel coordinates (u, v) of the positioning hole H2 corresponding to the camera E2 on the basis of the magnification parameter D of the camera E2 using Equation (4) and Equation (10) and stores the corrected coordinates (Ccx, Ccy) and coordinates (x, y) in the storage unit as the position coordinates of the third mark M2 and the positioning hole H2 after the magnification correction.

Accordingly, the imaging magnification correction for the positions of the positioning holes H1 and H2 and the positions of the third marks M1 and M2 in the captured images of the cameras E1 and E2 is performed.

Further, the correction unit 13a rotates the coordinates (Ccx, Ccy) of each of the corrected first mark image positions for position measurement and each of the target image positions (x, y) in the captured images of the cameras 31 to 34 and the cameras 71 to 74 by an angle indicated by the angle parameter R and then stores the obtained coordinates in the storage unit as the coordinates (Ccx, Ccy) of each of the corrected first mark image positions for position measurement and each of the target image positions (x, y) of the target points P1 to P4 and P1b to P4b.

The correction unit 13a rotates each of the position coordinates (Csx, Csy) of the third marks M1 and M2 after the magnification correction and each of the position coordinates (x, y) of the positioning holes H1 and H2 in the captured image of the cameras E1 and E2 by an angle indicated by the angle parameter R corresponding to each of the cameras E1 and E2 and then stores the obtained coordinates in the storage unit as each of the positional coordinates (Csx, Csy) of the corrected third marks M1 and M2 for position measurement and each of the position coordinates (x, y) of the positioning holes H1 and H2.

The target position acquisition unit 14a obtains the position coordinates (Ax, Ay) of each of the target points P1 to P4 on the placement surface 20 using Equations (11) and (12) on the basis of each of the corrected target image positions (x, y) and each of the corrected first mark image positions (Ccx, Ccy) for position measurement corresponding to each of the cameras 31 to 34 (the captured images G1 to G4) and each of the first mark reference positions (Ncx, Ncy) which are positions of the first marks on the placement surface 20.

On the other hand, the captured images of the cameras 71 to 74 are captured so that the Y axis direction becomes a reversed direction. Therefore, the target position acquisition unit 14a obtains the position coordinates (Ax, Ay) of each of the target points P1b to P4b on the placement surface 20 using Equation (11) and the following Equation (14) on the basis of the corrected image position (x, y) of each of the target points P1b to P4b and each of the corrected first mark image positions (Ccx, Ccy) corresponding to each of the captured images of the cameras 71 to 74 and each of the first mark reference positions (Ncx, Ncy) which are positions of the first marks on the placement surface 20.

$$Ay = y + Ccy - Ncy \quad (14)$$

The target position acquisition unit 14a stores the position coordinates of the target points P1 to P4 and P1b to P4b on the placement surface 20, which are obtained in this way, in the storage unit.

In addition to the processing of the length acquisition unit 15, the length acquisition unit 15a calculates lengths L1b to L4b of length measurement target portions on the basis of the positions of the target points P1b to P4b obtained by the target position acquisition unit 14a. Specifically, when the position coordinates of the target point P1b are (Ax1, Ay1), the position coordinates of the target point P2b are (Ax2, Ay2), the position coordinates of the target point P3b are (Ax3, Ay3) and the position coordinates of the target point P4b are (Ax4, Ay4), the lengths L1b to L4b are calculated by the length acquisition unit 15a in the same manner as the lengths L1 to L4 using Equation (13).

The length acquisition unit 15a may cause the display device 100 to display the lengths L1 to L4 and L1b to L4b obtained in this way. The length acquisition unit 15a may output the lengths L1 to L4 and L1b to L4b to an inspection device for inspecting the electrode unit U as data for determining quality of the electrode unit U. Further, the length acquisition unit 15a may store the lengths L1 to L4 and L1b to L4b in a database for quality control of the electrode unit U. The lengths L1 to L4 and L1b to L4b obtained in this way can be used for various purposes.

The hole position acquisition unit 16 obtains the position coordinates (Ax, Ay) of the positioning holes H1 and H2 on the placement surface 20 using Equations (11) and (12) on the basis of the position coordinates (Csx, Csy) of each of the third marks M1 and M2 and the position coordinates (x, y) of each of the positioning holes H1 and H2 after the correction (magnification and angle), and the third mark reference positions (Ncx, Ncy) of each of the third marks M1 and M2 on the placement surface 20 stored in the reference position storage unit 19a.

Since the hole position acquisition unit 16 calculates the position coordinates (Ax, Ay) of the positioning holes H1 and H2 on the basis of the positional relationship between the position coordinates (x, y) of each of the positioning holes H1 and H2 and the position coordinates (Csx, Csy) of each of the third marks M1 and M2 obtained by the cameras E1 and E2 with reference to each of the third mark reference positions (Ncx, Ncy) obtained by measurement with the highly accurate image measurement device in advance, when the electrode unit U is measured with the length measurement device 1 in a mass production process or the like, it is unnecessary to use the highly accurate image measurement device which is expensive and has a long measurement time, and it is possible to shorten the measurement time while improving the measurement accuracy.

The object angle acquisition unit 17 obtains a rotation angle Ru of the electrode unit U with respect to the placement surface 20 on the basis of the position coordinates (Ax, Ay) of each of the positioning holes H1 and H2 on the placement surface 20 obtained by the hole position acquisition unit 16 and the third mark reference position (Ncx, Ncy) of each of the third marks M1 and M2 on the placement surface 20 stored in the reference position storage unit 19a and then stores the rotation angle Ru in the storage unit. The rotation angle Ru is a rotation angle of the electrode unit U around a normal line of the placement surface 20.

Specifically, when the coordinates of the third mark reference position of the third mark M1 are (Ncx1, Ncy1) and the coordinates of the third mark reference position of the third mark M2 are (Ncx2, Ncy2), the object angle acquisition unit 17 calculates an angle Rm of an inclination of a straight line connecting the third mark M1 and the third mark M2 on the placement surface 20 using the following Equation (15).

$$Rm = \arctan\{(Ncy2-Ncy1)/(Ncx2-Ncx1)\} \quad (15)$$

Further, when the position coordinates of the positioning hole H1 are (Ax1, Ay1) and the position coordinates of the positioning hole H2 are (Ax2, Ay2), the object angle acquisition unit 17 calculates an angle Rh of an inclination of a straight line connecting the positioning hole H1 and the positioning hole H2 on the placement surface 20 using the following Equation (16).

$$Rh = \arctan\{(Ay2-Ay1)/(Ax2-Ax1)\} \quad (16)$$

Next, the object angle acquisition unit 17 calculates the rotation angle Ru of the electrode unit U with respect to the placement surface 20 using the following Equation (17).

$$\text{Rotation angle } Ru = Rh - Rm \quad (17)$$

For example, when the length measurement device 1a is used for inspection of mass-produced electrode units U in a manufacturing factory of the electrode unit U or the like, for example, for the purpose of quality control, it may be desired to compare the position coordinates of the target points P1 to P4 and P1b to P4b measured for each of the electrode units U on the placement surface 20. In such a case, when the rotation angles Ru of the electrode units U placed on the placement surface 20 are different from each other at the time of measurement, it is difficult to compare the position coordinates of the target points P1 to P4 and P1b to P4b in each of the electrode units U.

Therefore, since the rotation angle Ru of each of the electrode units U is calculated by the object angle acquisition unit 17 and the correction in which the position coordinates of the target points P1 to P4 and P1b to P4b are rotated by the rotation angle Ru is performed so that an orientation of the electrode unit U coincides with an orientation of the placement surface 20, it is easy to compare the position coordinates of the target points P1 to P4 and P1b to P4b in the plurality of electrode units U.

Figure 13:
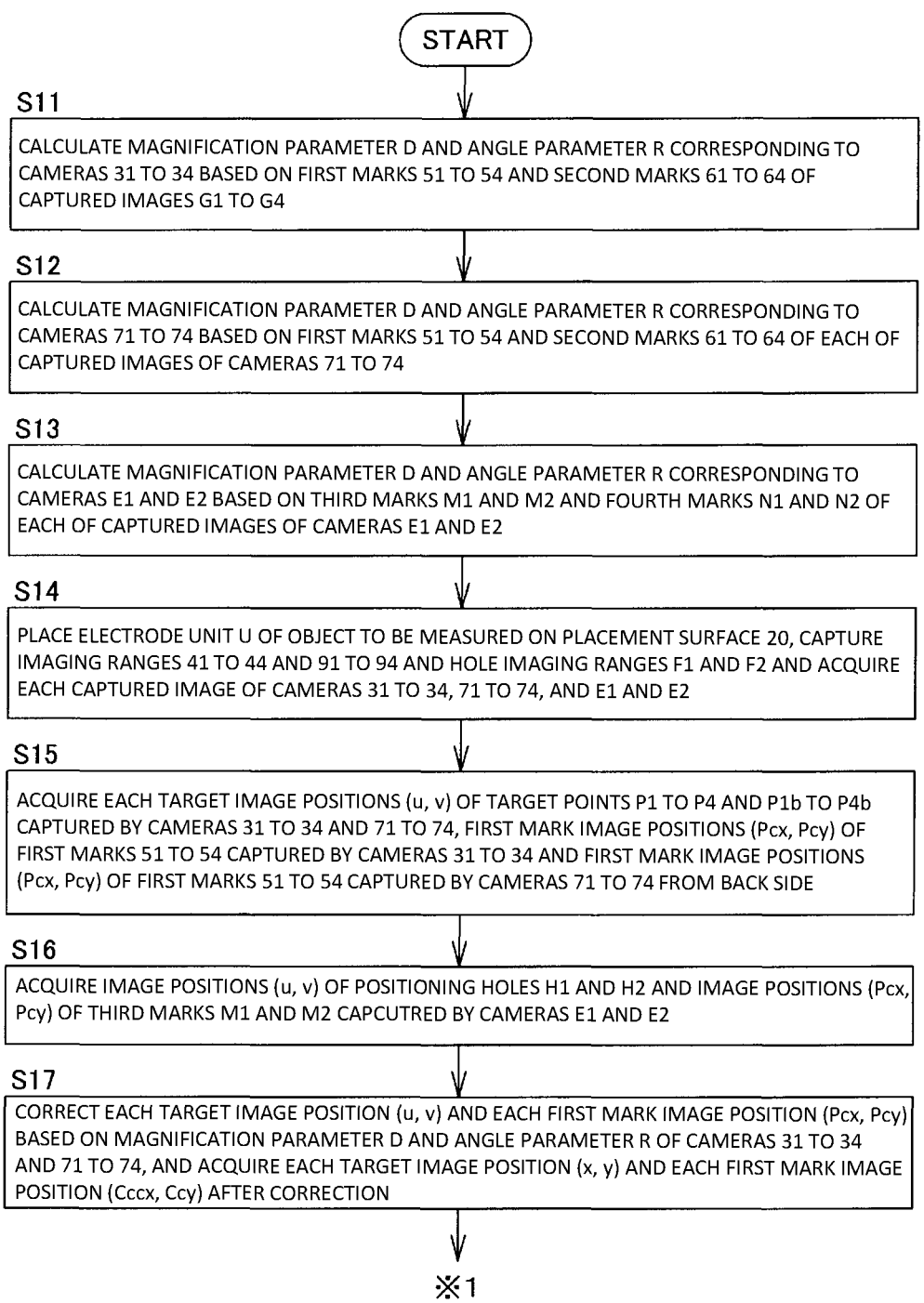
FIG. 13 is a flowchart showing an example of the operation of the length measurement device shown in FIG. 7.
Figure 14:
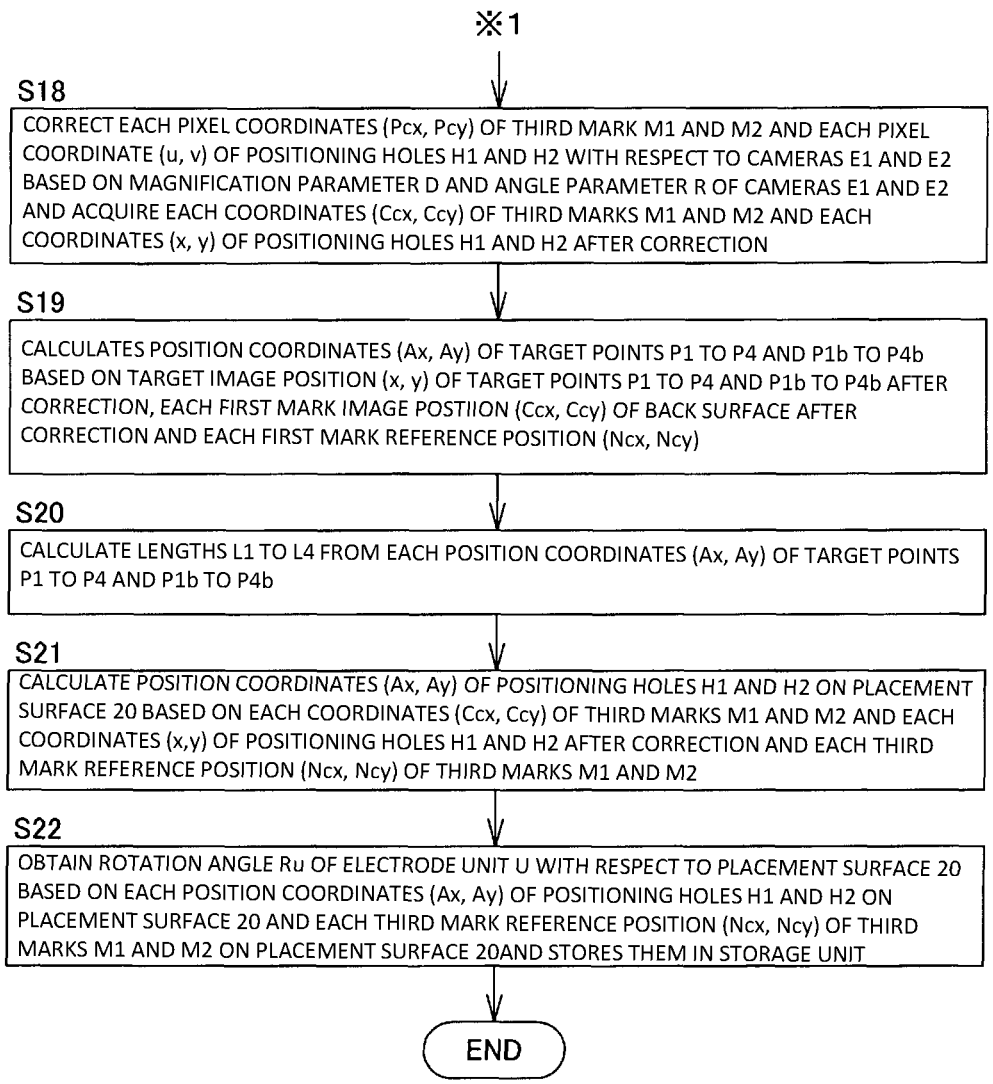
FIG. 14 is a flowchart showing the example of the operation of the length measurement device shown in FIG. 7.

FIGS. 13 and 14 are flowcharts showing an example of the operation of the length measurement device 1a shown in FIG. 7. First, in a state in which the electrode unit U is not placed on the placement surface 20, the parameter calculation unit 12a calculates the magnification parameters D and the angle parameters R corresponding to the cameras 31 to 34 on the basis of the first marks 51 to 54 and the second marks 61 to 64 of the captured images G1 to G4 (Step S11).

Next, the parameter calculation unit 12a calculates the magnification parameters D and the angle parameters R corresponding to the cameras 71 to 74 on the basis of the first marks 51 to 54 and the second marks 61 to 64 of each of the captured images of the cameras 71 to 74 (Step S12).

Next, the magnification parameters D and the angle parameters R corresponding to the cameras E1 and E2 are calculated on the basis of the third marks M1 and M2 and the fourth marks N1 and N2 of the captured images of the cameras E1 and E2 (Step S13).

Next, after the user positions the electrode unit U to be measured on the placement surface 20 to start the measurement of the electrode plates A and B, the imaging ranges 41 to 44 and 91 to 94 of each camera and the hole imaging ranges F1 and F2 are captured by the cameras 31 to 34, 71 to 74, and E1 and E2, and the captured images of each of the cameras are acquired (Step S14).

In this case, since the cameras 31 to 34 and 71 to 74 corresponding to the target points P1 to P4 and P1b to P4b are provided, there is no need to move the camera as in the background art or to turn over the electrode unit U to capture the electrode plate B. As a result, it is possible to shorten the measurement time of the lengths L1 to L4 and L1b to L4b and also to prevent the measurement accuracy from decreasing due to movement of the camera.

Next, each of the target image positions (u, v) of the target points P1 to P4 and P1b to P4b captured by the cameras 31 to 34 and 71 to 74, each of the first mark image positions (Pcx, Pcy) of the first marks 51 to 54 captured by the cameras 31 to 34, and each of the first mark image positions (Pcx, Pcy) of the first marks 51 to 54 captured from the back side by the cameras 71 to 74 are acquired by the image position acquisition unit 11a (Step S15).

Next, the image positions (u, v) of the positioning holes H1 and H2 and the image positions (Pcx, Pcy) of the third marks M1, M2 captured by the cameras E1 and E2 are acquired by the image position acquisition unit 11a (Step S16).

Next, the target image position (u, v) of each of the target points P1 to P4 and P1b to P4b and the first mark image position (Pcx, Pcy) corresponding to each of the cameras are corrected by the correction unit 13a on the basis of the magnification parameter D and angle parameter R of each of the cameras 31 to 34 and 71 to 74, and each of the corrected target image positions (x, y) and each of the corrected first mark image positions (Ccx, Ccy) are calculated (Step S17).

Next, the pixel coordinates (Pcx, Pcy) of each of the third marks M1 and M2 and the pixel coordinates (u, v) of each of the positioning holes H1 and H2 corresponding to the cameras E1 and E2 are corrected by the correction unit 13a on the basis of the magnification parameters D and angle parameters R of the cameras E1 and E2, and the corrected coordinates (Ccx, Ccy) of the third marks M1 and M2 and the corrected coordinates (x, y) of the positioning holes H1 and H2 are acquired (Step S18).

Next, the position coordinates (Ax, Ay) of the target points P1 to P4 and P1b to P4b on the placement surface 20 are calculated by the target position acquisition unit 14a on the basis of the corrected target image position (x, y) of the target points P1 to P4 and P1b to P4b, each of the corrected first mark image positions (Ccx, Ccy) on the front and back surfaces, and each of the first mark reference positions (Ncx, Ncy) (Step S19).

Next, the lengths L1 to L4 and L1b to L4b of the object to be measured are calculated from the position coordinates (Ax, Ay) of each of the target points P1 to P4, P1b to P4b by the length acquisition unit 15a (Step S20).

As described above, according to the processing of Steps S11 to S20, it is unnecessary to move the camera or to turn over the electrode unit U even when a length of an object to be measured having a large size is measured, and also since there is no reduction in accuracy due to the movement of the camera, it is possible to shorten the measurement time while improving the measurement accuracy.

Further, in the target position acquisition unit 14a (Step S19), since the position coordinates (Ax, Ay) of the target points P1 to P4 and P1b to P4b are calculated on the basis of the positional relationship between each of the target image positions (x, y) and each of the first mark image positions (Ccx, Ccy) obtained by the cameras 31 to 34 and 71 to 74 with reference to each of the first mark reference positions (Ncx, Ncy) on the front and back surfaces obtained by measurement with a highly accurate image measurement device in advance, when the electrode plates A and B are measured with the length measurement device 1 in a mass production process or the like, it is unnecessary to use the highly accurate image measurement device which is expensive and has a long measurement time, and it is possible to shorten the measurement time while improving the measurement accuracy.

Furthermore, since the imaging magnification and the mounting angle of the cameras 31 to 34 and 71 to 74 are corrected by the parameter calculation unit 12a and the correction unit 13a, the measurement accuracy of the lengths L1 to L4 and L1b to L4b is improved.

Next, the position coordinates (Ax, Ay) of the positioning holes H1 and H2 on the placement surface 20 are obtained by the hole position acquisition unit 16 on the basis of the position coordinates (Csx, Csy) of each of the third marks M1 and M2 and the position coordinates (x, y) of each of the positioning holes H1 and H2 after the correction (magnification and angle), and the third mark reference positions (Ncx, Ncy) of each of the third marks M1 and M2 on the placement surface 20 stored in the reference position storage unit 19a (Step S21).

Next, the rotation angle Ru of the electrode unit U with respect to the placement surface 20 is calculated by the object angle acquisition unit 17 on the basis of the position coordinates (Ax, Ay) of each of the positioning holes H1 and H2 on the placement surface 20 and the third mark reference position (Ncx, Ncy) of each of the third marks M1 and M2 on the placement surface 20 (Step S22).

The length measurement device 1a may not have the cameras 71 to 74, and the placement table 2 may not have a transparent region. In this case, the electrode unit U may have only one of the electrode plates A and B. Further, the length measurement device 1a may not include the cameras E1 and E2, the hole position acquisition unit 16, and the object angle acquisition unit 17, and the third marks M1 and M2 and the fourth marks N1 and N2 may not be formed on the placement surface 20.

Further, the object to be measured is not limited to the electrode plate, and the shape of the object to be measured is not limited to a rectangular shape, and it is sufficient that a plurality of target points are provided on the object to be measured, and it is not limited to four. The cameras 31 to 34 (first imaging units) and the cameras 71 to 74 (second imaging units) are provided in accordance with the number of target points and are not limited to four, respectively.

That is, the length measurement device according to one aspect of the present invention includes a placement table having a placement surface including a placement region on which an object to be measured is placed, first imaging units provided to respectively correspond to target points which are both ends of a length measurement target portion of the object to be measured that is placed on the placement region and configured to capture an image of an imaging range disposed to include the target points corresponding to each of the ends when the object to be measured is placed on the placement region, first marks respectively provided in a plurality of imaging ranges outside the placement region on the placement surface, a reference position storage unit configured to store positions of the plurality of first marks on the placement surface as first mark reference positions in advance, an image position acquisition unit configured to perform an image position acquiring process of acquiring a target image position which is a position of each of the target points in each of captured images and a first mark image position which is a position of each of the first marks in each of the captured images on the basis of the captured images captured by each of the first imaging units when the object to be measured is placed on the placement region, a target position acquisition unit configured to obtain a position of each of the target points on the placement surface on the basis of the target image position and the first mark image position corresponding to each of the plurality of captured images and each of the first mark reference positions which is a position of each of the first marks on the placement surface, and a length acquisition unit configured to obtain a length of the length measurement target portion on the basis of the position of each of the target points obtained by the target position acquisition unit.

According to such a configuration, the captured image including an image of the target points of the object to be measured and an image of the first marks formed on the placement surface in one screen is captured by each of the first imaging units. Additionally, the target image position which is the position of each of the target points in each of the captured images and the first mark image position which is the position of each of the first marks in each of the captured images are acquired by the image position acquisition unit. In this case, since the positions of the target points and the positions of the first marks in one captured image are acquired, a positional relationship between the target points and the first marks can be identified corresponding to each of the target points from position information acquired by the image position acquisition unit. The position of each of the first marks on the placement surface is stored in the reference position storage unit as a first mark reference position in advance. Since the first mark reference position is a fixed value for the device, the first mark reference position can be measured by a highly accurate measurement device in advance and stored in the reference position storage unit. Additionally, since a relative position of the target image position with respect to each of the first mark reference positions measured with high accuracy can be known on the basis of the target image position and the first mark image position corresponding to each of the captured images obtained by the target position acquisition unit and each of the first mark reference positions stored in advance, the target position acquisition unit can obtain the position of each of the target points on the placement surface with high accuracy. The length acquisition unit can obtain a distance between the positions of the respective target points obtained with high accuracy as the length of the length measurement target portion. Therefore, it is easy to improve the measurement accuracy of the length of the length measurement target portion. Also, even when the length of the object to be measured having a large size is measured, since there is no need to move the first imaging units as in the background art, the measurement time can readily be shortened while the measurement accuracy is improved.

Further, second marks may be provided within each of the imaging ranges on the placement surface to be spaced apart from the first marks, the reference position storage unit may further store information on positions of the plurality of second marks on the placement surface, and a parameter calculation unit configured to perform a parameter calculation process of calculating a parameter which corrects the target image position and the first mark image position on the basis of an image of the first marks and the second marks in the images captured by each of the first imaging units and the information stored in the reference position storage unit, and a correction unit configured to correct the target image position and the first mark image position using the parameters may be further included.

When variations occur in an imaging magnification of each of the first imaging units and a mounting state with respect to the placement surface, an error may occur in the positional relationship obtained from the image of the target points and the first marks in the captured image captured by each of the first imaging units, as a result, the measurement accuracy of the position of each of the target points obtained by the target position acquisition unit may be deteriorated, and thus the measurement accuracy of the length of the length measurement target portion may decrease. Therefore, the second marks are provided within each of the imaging ranges on the placement surface to be spaced apart from the first marks, and the information on the position of each of the second marks on the placement surface is additionally stored in the reference position storage unit. That is, the reference position storage unit stores the information on the positions of the first marks and the second marks within each of the imaging ranges. Therefore, in the parameter calculation process, the parameter which corrects the target image position and the first mark image position can be calculated from a difference between the information on the positions of the first and second marks stored in the reference position storage unit and the position information on the first and second marks in the image actually captured by each of the first imaging units. Additionally, since the target image position and the first mark image position are corrected by the correction unit using the parameter which can be obtained in this way, the accuracy of the target image position and the first mark image position obtained by the target position acquisition unit is improved. As a result, the measurement accuracy of the length of the length measurement target portion can be improved.

Further, the information on the positions of the second marks may include information indicating distances between the first marks and the second marks on the placement surface, the parameter may include a magnification parameter which corrects a deviation caused by an imaging magnification of each of the first imaging units, and the parameter calculation unit may calculate the magnification parameter corresponding to each of the first imaging units on the basis of the distances between the first marks and the second marks in the image captured by each of the first imaging units and distances between the first marks and the second marks based on the information on the positions of the second marks.

According to such a configuration, information indicating the distances between the first marks and the second marks on the placement surface is stored in the reference position storage unit in advance. When the imaging magnification of each of the first imaging units is deviated from a reference, the distances between the first marks and the second marks in the captured image of the first imaging unit are also deviated. Therefore, when the imaging magnification of each of the first imaging units is deviated from the reference, the distances between the first marks and the second marks in the image captured by each of the first imaging units and the distance between the first marks and the second marks based on the information on the positions of the second marks stored in advance are deviated from each other. Therefore, the parameter calculation unit can calculate the magnification parameter which corrects a deviation caused by the imaging magnification of each of the first imaging units on the basis of the distances between the first marks and the second marks in the image captured by each of the first imaging units and the distances between the first marks and the second marks based on the information on the positions of the second marks stored in advance.

Further, the information on the positions of the second marks may include second mark reference positions indicating the positions of the second marks on the placement surface, the parameter may include an angle parameter which corrects a deviation caused by a rotation angle around an axis parallel to an optical axis of each of the first imaging units with respect to the placement surface, and the parameter calculation unit may calculate the angle parameter corresponding to each of the first imaging units on the basis of the positions of the first and second marks in the image captured by each of the first imaging units and the first and second mark reference positions stored in the reference position storage unit.

When the first imaging unit is disposed so that an orientation thereof is deviated to rotate around the axis parallel to the optical axis with respect to the placement surface, the positional relationship between the first and second marks shown in the captured image of the first imaging unit is deviated in accordance with the deviation due to the rotation. Therefore, according to such a configuration, the parameter calculation unit can calculate the angle parameter which corrects the deviation caused by the rotation angle around the axis parallel to the optical axis of each of the first imaging units with respect to the placement surface on the basis of the positions of the first and second marks in the image captured by each of the first imaging units and the first and second mark reference positions stored in advance in the reference position storage unit.

Further, the placement table may have a plate shape, a transparent region may be provided at a position corresponding to each of the imaging ranges on the placement table, each of the first marks may be provided in each of the transparent regions, the length measurement device may further include second imaging units respectively provided to correspond to the plurality of transparent regions, each of the second imaging units may capture the first marks and the target points from a surface opposite to the placement surface of the placement table via the transparent region, and the image position acquisition unit may further perform an image position acquisition process on the basis of the captured image captured by each of the second imaging units when the object to be measured is placed on the placement region.

According to such a configuration, the placement table has the plate shape, and the transparent region is provided at a position corresponding to each of the imaging ranges on the placement table, and each of the first marks are provided in each of the transparent regions. Additionally, each of the second imaging unit captures the first marks and the target points from the surface opposite to the placement surface via the transparent region. Therefore, even though the measurement target portion is hidden and cannot be captured when imaging is performed from the side of the placement surface, the first marks and the target points can be captured by the second imaging units performing the imaging from side of the placement surface, and as a result, the image position acquisition unit can acquire the target image position and the first mark image position.

Further, the object to be measured may be a substantially rectangular electrode plate formed on at least one surface of a substantially rectangular transparent sheet to be spaced apart from a peripheral edge of the sheet at a distance, a pair of positioning holes for positioning may be formed at positions on both sides sandwiching the electrode plate on a surface of the sheet, each of the first imaging units may capture the first marks through the sheet, the length measurement device may further include a pair of third imaging units configured to capture an image of a pair of hole imaging ranges disposed to respectively include the pair of positioning holes when the sheet is placed on the placement surface so that the object to be measured is located in the placement region, and third marks respectively provided in the pair of hole imaging ranges on the placement surface, the reference position storage unit may further store in advance third mark reference positions of the pair of third marks on the placement surface, the image position acquisition unit may further acquire positions of the positioning holes and positions of the third marks in each image on the basis of the images captured by the pair of third imaging units when the object to be measured is placed on the placement region, and the length measurement device may further include a hole position acquisition unit which obtains the positions of the pair of positioning holes on the placement surface on the basis of the positions of the pair of positioning holes and the positions of the pair of third marks in the image acquired by the image position acquisition unit and the third mark reference positions of the pair of third marks on the placement surface stored in the reference position storage unit, and an object angle acquisition unit configured to obtain a rotation angle of the object to be measured around a normal line of the placement surface on the basis of the positions of the pair of positioning holes on the placement surface obtained by the hole position acquisition unit and the pair of third mark reference positions on the placement surface stored in the reference position storage unit.

According to such a configuration, when a unit in which a substantially rectangular electrode plate is formed on at least one surface of a substantially rectangular transparent sheet is provided and the electrode plate of the unit in which a pair of positioning holes for positioning are formed in the sheet is the object to be measured, the pair of positioning holes and the third marks are captured by the pair of third imaging units, and the positions of the positioning holes and the positions of the third marks in each of the images are acquired, and the positions of the pair of positioning holes on the placement surface are obtained on the basis of the obtained positions of the pair of positioning holes and the positions of the pair of third marks and the pair of third mark reference positions stored in the reference position storage unit, and the rotation angle of the object to be measured around the normal line of the placement surface is obtained on the basis of the positions of the pair of positioning holes and the pair of third mark reference positions stored in the reference position storage unit.

Further, the third marks may be disposed at positions corresponding to inner sides of the pair of positioning holes when the object to be measured is placed on the placement region.

According to such a configuration, it is easy to clearly capture the third marks. As a result, it is easy to improve the accuracy with which the hole position acquisition unit acquires the position of each of the third marks, and thus it is easy to improve calculation accuracy of the rotation angle of the object to be measured around the normal line of the placement surface.

Further, the measurement target may have a polygonal shape having a plurality of sides, and the image position acquisition unit may acquire a point at which extension lines of the plurality of sides intersect as a target image position which is a position of each of the target points in each of the captured images.

According to such a configuration, it is possible to accurately measure a length of each side of a polygon even when a corner of the object to be measured is rounded or the like.

In the length measurement device having such a configuration, the measurement time can readily be shortened while the measurement accuracy is improved when a length of an object to be measured having a large size is measured.

This application is based on Japanese Patent Application No. 2016-194295 filed on Sep. 30, 2016, the contents of which are included in the present application. The specific embodiments or examples described in the claim of the mode for carrying out the invention are intended to clarify the technical contents of the present invention, and the present invention should not be narrowly interpreted as being limited only to such specific examples.

The invention claimed is:

1. A length measurement device comprising:
a placement table having a placement surface including a placement region on which an object to be measured is placed;
first cameras provided to respectively correspond to target points which are both ends of a length measurement target portion of the object to be measured that is placed on the placement region and configured to capture an image of an imaging range, wherein the imaging range is disposed to include the corresponding target points when the object to be measured is placed on the placement region;
first marks respectively provided in a plurality of imaging ranges outside the placement region on the placement surface;
a memory configured to store positions of the plurality of first marks on the placement surface as first mark reference positions in advance;
a processor configured to perform an image position acquiring process of acquiring a target image position which is a position of each of the target points in each of captured images and a first mark image position which is a position of each of the first marks in each of the captured images on the basis of the captured images captured by each of the first cameras when the object to be measured is placed on the placement region, obtain a position of each of the target points on the placement surface on the basis of the target image position and the first mark image position corresponding to each of the plurality of captured images and each of the first mark reference positions which is a position of each of the first marks on the placement surface, and obtain a length of the length measurement target portion on the basis of the position of each of the target points obtained by the processor.

2. The length measurement device according to claim 1, wherein:
second marks are provided within each of the imaging ranges on the placement surface to be spaced apart from the first marks,
the memory further stores information on positions of the plurality of second marks on the placement surface, and
The length measurement device further comprises:
a processor configured to perform a parameter calculation process of calculating a parameter which corrects the target image position and the first mark image position on the basis of an image of the first marks and the second marks in the images captured by each of the first cameras and the information stored in the memory and correct the target image position and the first mark image position using the parameters.

3. The length measurement device according to claim 2, wherein:
the information on the positions of the second marks includes information indicating distances between the first marks and the second marks on the placement surface,
the parameter includes a magnification parameter which corrects a deviation caused by an imaging magnification of each of the first cameras, and
the processor calculates the magnification parameter corresponding to each of the first cameras on the basis of the distances between the first marks and the second marks in the image captured by each of the first cameras and distances between the first marks and the second marks based on the information on the positions of the second marks.

4. The length measurement device according to claim 3, wherein:
the information on the positions of the second marks includes second mark reference positions indicating the positions of the second marks on the placement surface,
the parameter includes an angle parameter which corrects a deviation caused by a rotation angle around an axis parallel to an optical axis of each of the first cameras with respect to the placement surface, and
the processor calculates the angle parameter corresponding to each of the first cameras on the basis of the positions of the first and second marks in the image captured by each of the first cameras and the first and second mark reference positions stored in the memory.

5. The length measurement device according to claim 4, wherein:
the placement table has a plate shape,
a transparent region is provided at a position corresponding to each of the imaging ranges on the placement table,
each of the first marks is provided in each of the transparent regions,
the length measurement device further includes second cameras respectively provided to correspond to the plurality of transparent regions,
each of the second cameras captures the first marks and the target points from a surface opposite to the placement surface of the placement table via the transparent region, and
the processor further performs an image position acquisition process on the basis of the captured image captured by each of the second cameras when the object to be measured is placed on the placement region.

6. The length measurement device according to claim 5, wherein:
the object to be measured is a substantially rectangular electrode plate formed on at least one surface of a substantially rectangular transparent sheet to be spaced apart from a peripheral edge of the sheet at a distance,
a pair of positioning holes for positioning are formed at positions on both sides sandwiching the electrode plate on a surface of the sheet,
each of the first cameras captures the first marks through the sheet,
the length measurement device further includes:
a pair of third cameras configured to capture an image of a pair of hole imaging ranges, wherein the pair of hole imaging ranges is disposed to respectively include the pair of positioning holes when the sheet is placed on the placement surface so that the object to be measured is located in the placement region; and
third marks respectively provided in the pair of hole imaging ranges on the placement surface,
the memory further stores in advance third mark reference positions of the pair of third marks on the placement surface,
the processor further acquires positions of the positioning holes and positions of the third marks in each image on the basis of the images captured by the pair of third cameras when the object to be measured is placed on the placement region, and
the processor obtains the positions of the pair of positioning holes on the placement surface on the basis of the positions of the pair of positioning holes and the positions of the pair of third marks in the image acquired by the processor and the third mark reference positions of the pair of third marks on the placement surface stored in the memory and is configured to obtain a rotation angle of the object to be measured around a normal line of the placement surface on the basis of the positions of the pair of positioning holes on the placement surface obtained by the processor and the pair of third mark reference positions on the placement surface stored in the memory.

7. The length measurement device according to claim 6, wherein the third marks are disposed at positions corresponding to inner sides of the pair of positioning holes when the object to be measured is placed on the placement region.

8. The length measurement device according to claim 7, wherein:
the measurement target has a polygonal shape having a plurality of sides, and
the processor acquires a point at which extension lines of the plurality of sides intersect as a target image position which is a position of each of the target points in each of the captured images.

9. The length measurement device according to claim 3, wherein:
the placement table has a plate shape,
a transparent region is provided at a position corresponding to each of the imaging ranges on the placement table,
each of the first marks is provided in each of the transparent regions,
the length measurement device further includes second cameras respectively provided to correspond to the plurality of transparent regions,
each of the second cameras captures the first marks and the target points from a surface opposite to the placement surface of the placement table via the transparent region, and
the processor further performs an image position acquisition process on the basis of the captured image captured by each of the second cameras when the object to be measured is placed on the placement region.

10. The length measurement device according to claim 2, wherein:
the information on the positions of the second marks includes second mark reference positions indicating the positions of the second marks on the placement surface,
the parameter includes an angle parameter which corrects a deviation caused by a rotation angle around an axis parallel to an optical axis of each of the first cameras with respect to the placement surface, and
the processor calculates the angle parameter corresponding to each of the first cameras on the basis of the positions of the first and second marks in the image captured by each of the first cameras and the first and second mark reference positions stored in the memory.

11. The length measurement device according to claim 10, wherein:
the placement table has a plate shape,
a transparent region is provided at a position corresponding to each of the imaging ranges on the placement table,
each of the first marks is provided in each of the transparent regions,
the length measurement device further includes second cameras respectively provided to correspond to the plurality of transparent regions,
each of the second cameras captures the first marks and the target points from a surface opposite to the placement surface of the placement table via the transparent region, and
the processor further performs an image position acquisition process on the basis of the captured image captured by each of the second cameras when the object to be measured is placed on the placement region.

12. The length measurement device according to claim 10, wherein:
the object to be measured is a substantially rectangular electrode plate formed on at least one surface of a substantially rectangular transparent sheet to be spaced apart from a peripheral edge of the sheet at a distance,
a pair of positioning holes for positioning are formed at positions on both sides sandwiching the electrode plate on a surface of the sheet,
each of the first cameras captures the first marks through the sheet,
the length measurement device further includes:
a pair of third cameras configured to capture an image of a pair of hole imaging ranges, wherein the pair of hole imaging ranges is disposed to respectively include the pair of positioning holes when the sheet is placed on the placement surface so that the object to be measured is located in the placement region; and
third marks respectively provided in the pair of hole imaging ranges on the placement surface,
the memory further stores in advance third mark reference positions of the pair of third marks on the placement surface,
the processor further acquires positions of the positioning holes and positions of the third marks in each image on the basis of the images captured by the pair of third cameras when the object to be measured is placed on the placement region, and
the processor obtains the positions of the pair of positioning holes on the placement surface on the basis of the positions of the pair of positioning holes and the positions of the pair of third marks in the image acquired by the processor and the third mark reference positions of the pair of third marks on the placement surface stored in the memory and is configured to obtain a rotation angle of the object to be measured around a normal line of the placement surface on the basis of the positions of the pair of positioning holes on the placement surface obtained by the processor and the pair of third mark reference positions on the placement surface stored in the memory.

13. The length measurement device according to claim 2, wherein:
the placement table has a plate shape,
a transparent region is provided at a position corresponding to each of the imaging ranges on the placement table,
each of the first marks is provided in each of the transparent regions,
the length measurement device further includes second cameras respectively provided to correspond to the plurality of transparent regions, each of the second cameras captures the first marks and the target points from a surface opposite to the placement surface of the placement table via the transparent region, and the processor further performs an image position acquisition process on the basis of the captured image captured by each of the second cameras when the object to be measured is placed on the placement region.

14. The length measurement device according to claim 13, wherein:

the object to be measured is a substantially rectangular electrode plate formed on at least one surface of a substantially rectangular transparent sheet to be spaced apart from a peripheral edge of the sheet at a distance, a pair of positioning holes for positioning are formed at positions on both sides sandwiching the electrode plate on a surface of the sheet, each of the first cameras captures the first marks through the sheet, the length measurement device further includes:

a pair of third cameras configured to capture an image of a pair of hole imaging ranges, wherein the pair of hole imaging ranges is disposed to respectively include the pair of positioning holes when the sheet is placed on the placement surface so that the object to be measured is located in the placement region; and third marks respectively provided in the pair of hole imaging ranges on the placement surface, the memory further stores in advance third mark reference positions of the pair of third marks on the placement surface, the processor further acquires positions of the positioning holes and positions of the third marks in each image on the basis of the images captured by the pair of third cameras when the object to be measured is placed on the placement region, and the processor obtains the positions of the pair of positioning holes on the placement surface on the basis of the positions of the pair of positioning holes and the positions of the pair of third marks in the image acquired by the processor and the third mark reference positions of the pair of third marks on the placement surface stored in the memory and is configured to obtain a rotation angle of the object to be measured around a normal line of the placement surface on the basis of the positions of the pair of positioning holes on the placement surface obtained by the processor and the pair of third mark reference positions on the placement surface stored in the memory.

15. The length measurement device according to claim 2, wherein:

the object to be measured is a substantially rectangular electrode plate formed on at least one surface of a substantially rectangular transparent sheet to be spaced apart from a peripheral edge of the sheet at a distance, a pair of positioning holes for positioning are formed at positions on both sides sandwiching the electrode plate on a surface of the sheet, each of the first cameras captures the first marks through the sheet, the length measurement device further includes:

a pair of third cameras configured to capture an image of a pair of hole imaging ranges, wherein the pair of hole imaging ranges is disposed to respectively include the pair of positioning holes when the sheet is placed on the placement surface so that the object to be measured is located in the placement region; and third marks respectively provided in the pair of hole imaging ranges on the placement surface, the memory further stores in advance third mark reference positions of the pair of third marks on the placement surface, the processor further acquires positions of the positioning holes and positions of the third marks in each image on the basis of the images captured by the pair of third cameras when the object to be measured is placed on the placement region, and the processor obtains the positions of the pair of positioning holes on the placement surface on the basis of the positions of the pair of positioning holes and the positions of the pair of third marks in the image acquired by the processor and the third mark reference positions of the pair of third marks on the placement surface stored in the memory and is configured to obtain a rotation angle of the object to be measured around a normal line of the placement surface on the basis of the positions of the pair of positioning holes on the placement surface obtained by the processor and the pair of third mark reference positions on the placement surface stored in the memory.

16. The length measurement device according to claim 1, wherein:

the placement table has a plate shape, a transparent region is provided at a position corresponding to each of the imaging ranges on the placement table, each of the first marks is provided in each of the transparent regions, the length measurement device further includes second cameras respectively provided to correspond to the plurality of transparent regions, each of the second cameras captures the first marks and the target points from a surface opposite to the placement surface of the placement table via the transparent region, and the processor further performs an image position acquisition process on the basis of the captured image captured by each of the second cameras when the object to be measured is placed on the placement region.

17. The length measurement device according to claim 16, wherein:

the object to be measured is a substantially rectangular electrode plate formed on at least one surface of a substantially rectangular transparent sheet to be spaced apart from a peripheral edge of the sheet at a distance, a pair of positioning holes for positioning are formed at positions on both sides sandwiching the electrode plate on a surface of the sheet, each of the first cameras captures the first marks through the sheet, the length measurement device further includes:

a pair of third cameras configured to capture an image of a pair of hole imaging ranges, wherein the pair of hole imaging ranges is disposed to respectively include the pair of positioning holes when the sheet is placed on the placement surface so that the object to be measured is located in the placement region; and third marks respectively provided in the pair of hole imaging ranges on the placement surface, the memory further stores in advance third mark reference positions of the pair of third marks on the placement surface, the processor further acquires positions of the positioning holes and positions of the third marks in each image on the basis of the images captured by the pair of third cameras when the object to be measured is placed on the placement region, and the processor obtains the positions of the pair of positioning holes on the placement surface on the basis of the positions of the pair of positioning holes and the positions of the pair of third marks in the image acquired by the processor and the third mark reference positions of the pair of third marks on the placement surface stored in the memory and is configured to obtain a rotation angle of the object to be measured around a normal line of the placement surface on the basis of the positions of the pair of positioning holes on the placement surface obtained by the processor and the pair of third mark reference positions on the placement surface stored in the memory.

18. The length measurement device according to claim 1, wherein:

the object to be measured is a substantially rectangular electrode plate formed on at least one surface of a substantially rectangular transparent sheet to be spaced apart from a peripheral edge of the sheet at a distance, a pair of positioning holes for positioning are formed at positions on both sides sandwiching the electrode plate on a surface of the sheet, each of the first cameras captures the first marks through the sheet, the length measurement device further includes:

a pair of third cameras configured to capture an image of a pair of hole imaging ranges, wherein the pair of hole imaging ranges is disposed to respectively include the pair of positioning holes when the sheet is placed on the placement surface so that the object to be measured is located in the placement region; and third marks respectively provided in the pair of hole imaging ranges on the placement surface, the memory further stores in advance third mark reference positions of the pair of third marks on the placement surface, the processor further acquires positions of the positioning holes and positions of the third marks in each image on the basis of the images captured by the pair of third cameras when the object to be measured is placed on the placement region, and the processor obtains the positions of the pair of positioning holes on the placement surface on the basis of the positions of the pair of positioning holes and the positions of the pair of third marks in the image acquired by the processor and the third mark reference positions of the pair of third marks on the placement surface stored in the memory and is configured to obtain a rotation angle of the object to be measured around a normal line of the placement surface on the basis of the positions of the pair of positioning holes on the placement surface obtained by the processor and the pair of third mark reference positions on the placement surface stored in the memory.

19. The length measurement device according to claim 18, wherein the third marks are disposed at positions corresponding to inner sides of the pair of positioning holes when the object to be measured is placed on the placement region.

20. The length measurement device according to claim 1, wherein:

the measurement target has a polygonal shape having a plurality of sides, and the processor acquires a point at which extension lines of the plurality of sides intersect as a target image position which is a position of each of the target points in each of the captured images.

* * * * *